(12) United States Patent
Chang et al.

(10) Patent No.: US 12,356,646 B2
(45) Date of Patent: Jul. 8, 2025

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Jung-Hao Chang, Taichung (TW); Li-Te Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 76 days.

(21) Appl. No.: 18/360,427

(22) Filed: Jul. 27, 2023

(65) Prior Publication Data

US 2024/0021710 A1    Jan. 18, 2024

Related U.S. Application Data

(60) Continuation of application No. 17/411,704, filed on Aug. 25, 2021, now Pat. No. 11,769,822, which is a division of application No. 16/592,422, filed on Oct. 3, 2019, now Pat. No. 11,107,907.

(60) Provisional application No. 62/753,058, filed on Oct. 30, 2018.

(51) Int. Cl.
| | |
|---|---|
| *H10D 30/01* | (2025.01) |
| *H01L 21/311* | (2006.01) |
| *H01L 21/3213* | (2006.01) |
| *H10D 30/62* | (2025.01) |
| *H10D 64/01* | (2025.01) |

(52) U.S. Cl.
CPC ...... *H10D 30/024* (2025.01); *H01L 21/31116* (2013.01); *H01L 21/32136* (2013.01); *H10D 30/62* (2025.01); *H10D 64/01* (2025.01); *H10D 64/017* (2025.01); *H10D 64/021* (2025.01)

(58) Field of Classification Search
CPC ............ H10D 30/024; H01L 21/31116; H01L 21/32136
See application file for complete search history.

(56) References Cited

U.S. PATENT DOCUMENTS

| | | | |
|---|---|---|---|
| 8,357,603 B2* | 1/2013 | Chan .................... | H10D 84/038 438/591 |
| 8,513,722 B2* | 8/2013 | Tang .................... | H10D 86/215 257/302 |
| 9,023,708 B2* | 5/2015 | Chen .................... | H10D 64/017 438/299 |
| 9,577,067 B2* | 2/2017 | Ho ........................ | H10D 64/667 |

(Continued)

FOREIGN PATENT DOCUMENTS

| | | | | |
|---|---|---|---|---|
| CN | 106663667 A | | 5/2017 | |
| CN | 106663667 B | * | 2/2020 | ........... H01L 21/304 |

(Continued)

*Primary Examiner* — Laura M Menz
(74) *Attorney, Agent, or Firm* — Maschoff Brennan

(57) ABSTRACT

A method includes forming a gate structure across a channel region from a top view, the gate structure comprising a work function metal and a gate dielectric layer wrapping around the work function metal, the gate dielectric layer having a U-shaped cross-sectional profile; performing a first plasma etching process, by using a chlorine-containing reactant, on the gate structure; performing a second plasma etching process, by using a bromine-containing, reactant on the gate structure.

20 Claims, 40 Drawing Sheets

(56) References Cited

U.S. PATENT DOCUMENTS

| | | | | |
|---|---|---|---|---|
| 9,972,494 | B1* | 5/2018 | Bentley | H01L 21/32134 |
| 10,062,752 | B1* | 8/2018 | Leobandung | H10D 62/8503 |
| 10,163,626 | B2* | 12/2018 | Lin | H10D 30/0227 |
| 10,276,676 | B1* | 4/2019 | Liang | H10D 30/6217 |
| 10,283,605 | B2* | 5/2019 | Lin | H10D 64/667 |
| 10,283,623 | B2* | 5/2019 | Cheng | H10D 64/691 |
| 10,347,717 | B2* | 7/2019 | Leobandung | H01L 21/182 |
| 10,483,370 | B2* | 11/2019 | Chang | H10D 64/021 |
| 10,770,559 | B2* | 9/2020 | Liang | H10D 30/0243 |
| 10,790,195 | B2* | 9/2020 | Chang | H01L 23/5226 |
| 11,075,275 | B2* | 7/2021 | Chiu | H10D 84/0193 |
| 11,107,907 | B2* | 8/2021 | Chang | H10D 62/151 |
| 11,374,126 | B2* | 6/2022 | Yang | H10D 30/024 |
| 11,469,143 | B2* | 10/2022 | Chang | H10D 84/834 |
| 11,637,102 | B2* | 4/2023 | Chiang | H10D 30/6735 257/401 |
| 11,769,822 | B2* | 9/2023 | Chang | H01L 21/32136 257/401 |
| 12,166,075 | B2* | 12/2024 | Cheng | H10D 84/038 |
| 2011/0151655 | A1* | 6/2011 | Chan | H10D 30/608 257/E21.177 |
| 2011/0215408 | A1* | 9/2011 | Tang | H10D 30/711 257/E29.273 |
| 2012/0299115 | A1* | 11/2012 | Chuang | H10D 62/115 257/E21.546 |
| 2014/0252487 | A1* | 9/2014 | Stephens | H10D 84/0177 257/368 |
| 2014/0315365 | A1* | 10/2014 | Chen | H10D 84/038 438/299 |
| 2016/0056262 | A1* | 2/2016 | Ho | H10D 64/018 257/288 |
| 2016/0141384 | A1* | 5/2016 | Lee | H10D 30/797 438/275 |
| 2016/0181163 | A1* | 6/2016 | Huang | H10D 84/85 257/369 |
| 2016/0197069 | A1* | 7/2016 | Morrow | H01L 23/5386 257/393 |
| 2016/0365426 | A1* | 12/2016 | Ching | H01L 21/283 |
| 2017/0213768 | A1 | 7/2017 | Steigerwald et al. | |
| 2017/0222005 | A1* | 8/2017 | Lin | H01L 21/28088 |
| 2018/0069095 | A1* | 3/2018 | Chang | H10D 30/62 |
| 2018/0166274 | A1* | 6/2018 | Lin | H01L 21/02247 |
| 2019/0035917 | A1* | 1/2019 | Cheng | H10D 64/017 |
| 2019/0123138 | A1* | 4/2019 | Leobandung | H10D 30/63 |
| 2019/0165123 | A1* | 5/2019 | Lo | H10D 84/834 |
| 2019/0165132 | A1* | 5/2019 | Lo | H10D 64/513 |
| 2019/0273145 | A1* | 9/2019 | Chiu | H10D 30/62 |
| 2019/0333807 | A1* | 10/2019 | Tung | H01L 21/7684 |
| 2019/0334003 | A1* | 10/2019 | Liang | H10D 30/024 |
| 2020/0035549 | A1* | 1/2020 | Wu | H01L 21/76832 |
| 2020/0043795 | A1* | 2/2020 | Chang | H01L 21/76816 |
| 2020/0105532 | A1* | 4/2020 | Liao | H10D 84/038 |
| 2020/0135901 | A1* | 4/2020 | Chang | H01L 21/31116 |
| 2020/0251574 | A1* | 8/2020 | Liao | H10D 64/693 |
| 2020/0357899 | A1* | 11/2020 | Lo | H10D 64/017 |
| 2020/0395356 | A1* | 12/2020 | Shu | H10D 62/115 |
| 2020/0411667 | A1* | 12/2020 | Wong | H01L 21/02293 |
| 2021/0013045 | A1* | 1/2021 | Chen | H01L 21/3081 |
| 2021/0013103 | A1* | 1/2021 | Chang | H10D 84/0149 |
| 2021/0210614 | A1* | 7/2021 | Lo | H10D 30/0243 |
| 2021/0242324 | A1* | 8/2021 | Yao | H10D 64/017 |
| 2021/0375858 | A1* | 12/2021 | Chiang | H10D 30/6735 |
| 2021/0384325 | A1* | 12/2021 | Chang | H10D 62/151 |
| 2021/0408256 | A1* | 12/2021 | Wu | H10D 64/015 |
| 2022/0320088 | A1* | 10/2022 | Pan | H10D 30/6729 |
| 2022/0336623 | A1* | 10/2022 | Lo | H10D 64/518 |
| 2022/0359724 | A1* | 11/2022 | Lo | H10D 84/0158 |
| 2022/0384268 | A1* | 12/2022 | Chang | H10D 30/024 |
| 2023/0014007 | A1* | 1/2023 | Bao | H01L 21/67023 |
| 2023/0154922 | A1* | 5/2023 | Yang | H10D 84/0158 257/369 |
| 2023/0335586 | A1* | 10/2023 | Cheng | H10D 62/121 |
| 2024/0021710 | A1* | 1/2024 | Chang | H01L 21/31122 |
| 2024/0363630 | A1* | 10/2024 | Pan | H10D 84/0188 |

FOREIGN PATENT DOCUMENTS

| | | | | |
|---|---|---|---|---|
| CN | 113539818 | A | * 10/2021 | H01J 37/32871 |
| CN | 113555321 | A | * 10/2021 | H01L 21/31116 |

* cited by examiner

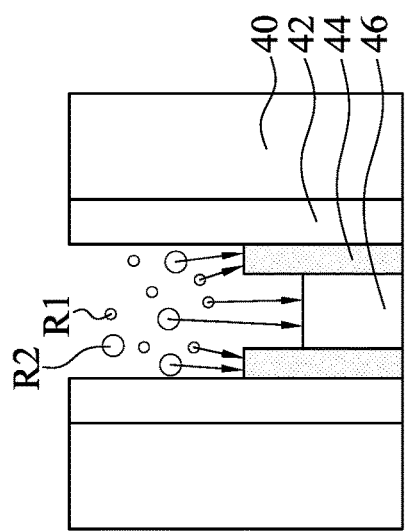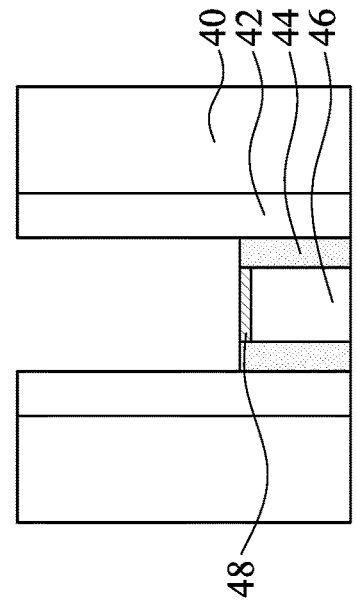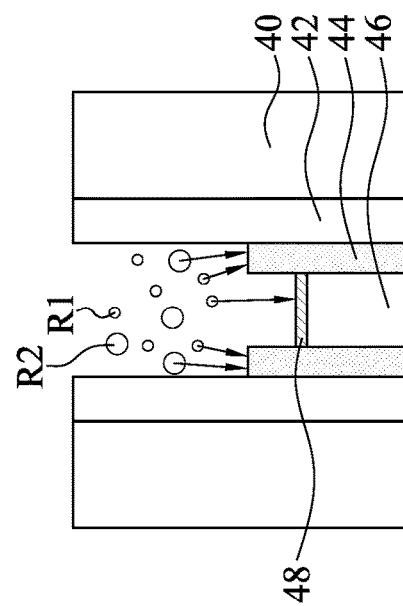

SEMICONDUCTOR DEVICE AND METHOD FOR MANUFACTURING THE SAME

PRIORITY CLAIM AND CROSS-REFERENCE

The present application is a Continuation Application of U.S. application Ser. No. 17/411,704, filed Aug. 25, 2021, which is a Divisional Application of the U.S. application Ser. No. 16/592,422, filed Oct. 3, 2019, now U.S. Pat. No. 11,107,907, issued Aug. 31, 2021, which claims priority to U.S. Provisional Application Ser. No. 62/753,058, filed Oct. 30, 2018, which is herein incorporated by reference in their entirety.

BACKGROUND

As devices become smaller and integration density increases, reactive ion etching (RIE) has become a process in anisotropic etching of semiconductor features. RIE or ion-enhanced etching works by a combination of physical and chemical mechanisms for achieving selectivity and anisotropicity during the etching process. Generally, plasma assisted etching operates in the milliTorr range and above. Generally, three processes compete with each other during plasma etching; physical bombardment by ions, chemical etching by radicals and ions, and surface passivation by the deposition of passivating films. In some applications, for example, high density plasmas (HDP) having a higher density of ions and operating at lower pressures has been increasingly used in etching processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 27A-27G are schematic cross-sectional views of a wafer during a metal gate etch back (MGEB) process according to some embodiments of the present disclosure.

DETAILED DESCRIPTION

Figure 1A:
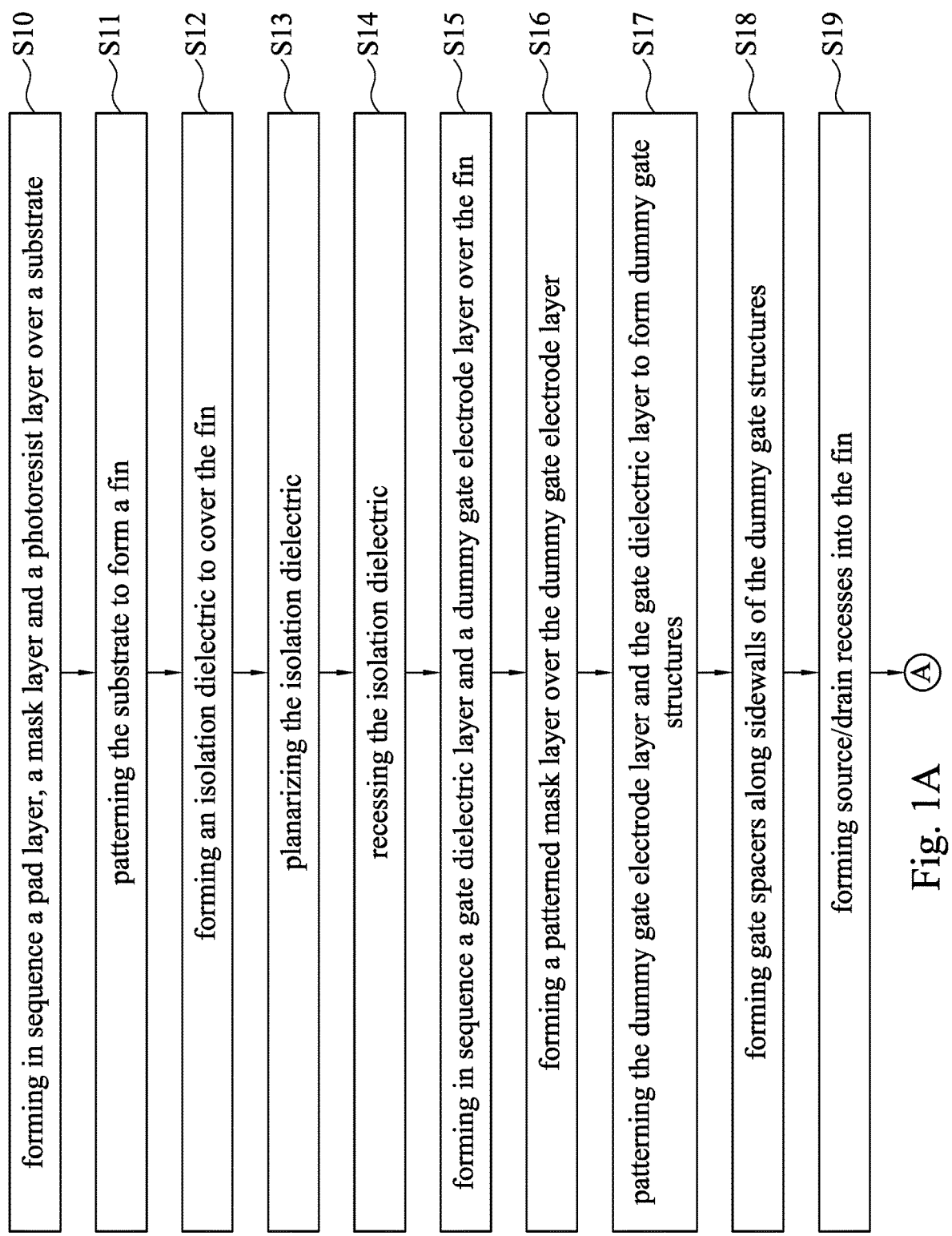
FIGS. 1A to 1B illustrate a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide an improved metal gate etch back (MGEB) process, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or the like. In addition, embodiments disclosed herein may be employed in the formation of P-type and/or N-type devices.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
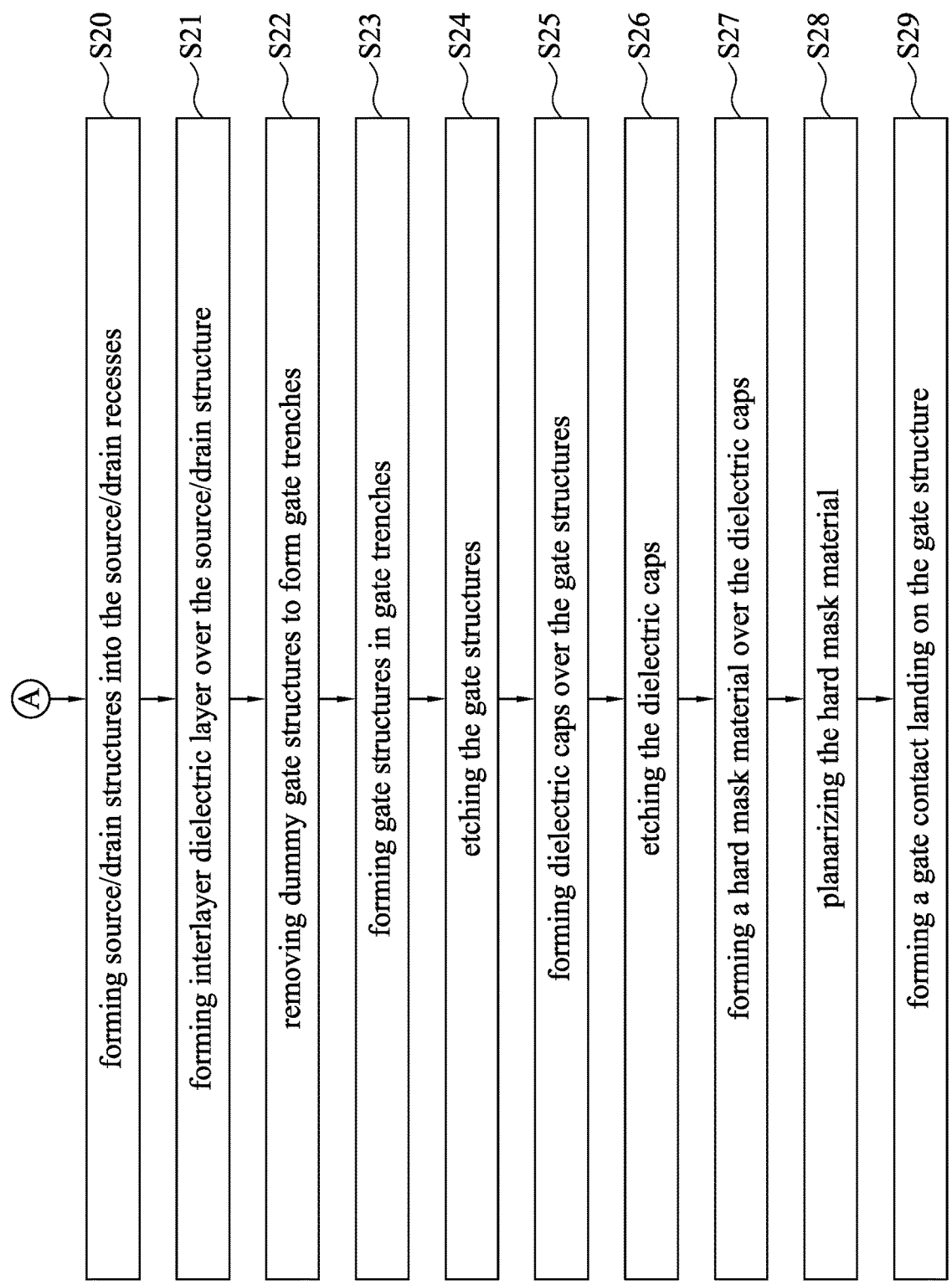

Referring now to FIGS. 1A and 1B, illustrated are an exemplary method M for fabrication of a semiconductor device in accordance with some embodiments, in which the fabrication includes the improved MGEB process. The method M includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M includes fabrication of a FinFET device. However, the fabrication of FinFET device is merely example for describing the improved MGEB process according to some embodiments of the present disclosure.

Figure 2:
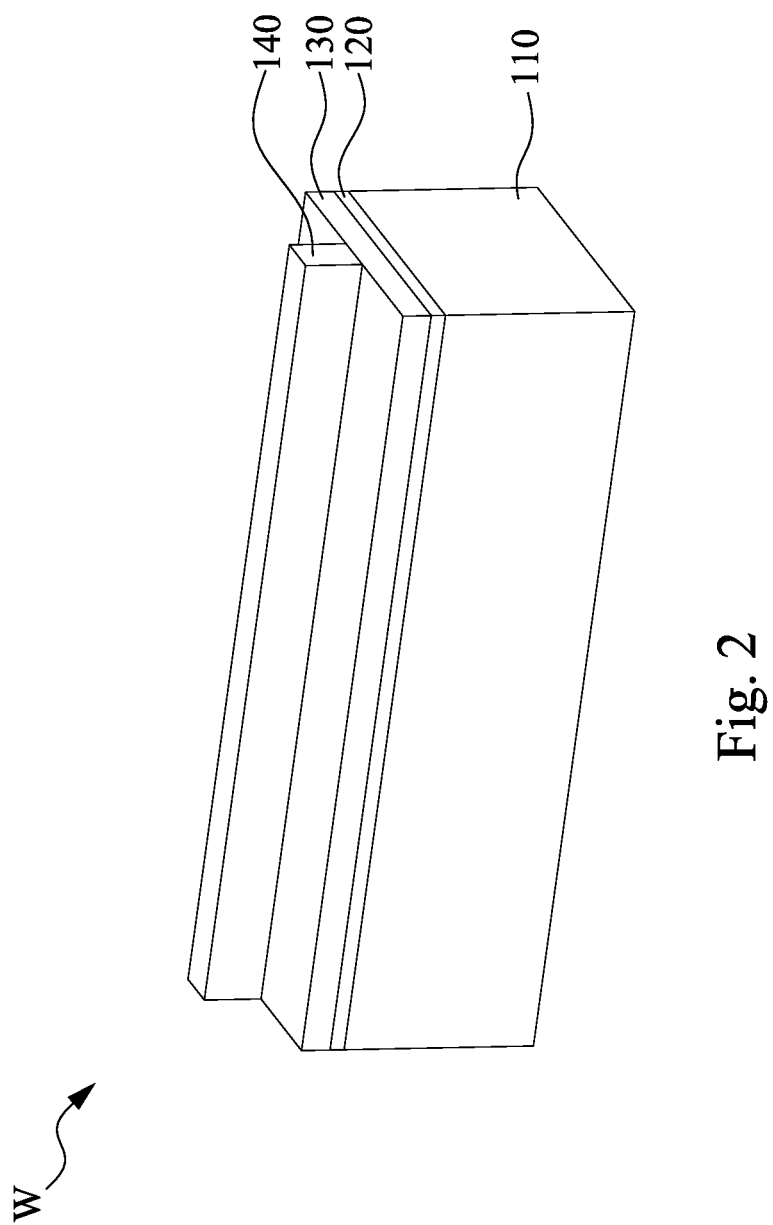
FIGS. 2 to 14, 15A, 15B, 16A, 16B, 17A, 17B, 18A, 18B, 19A, 19B, 20A, 20B, 21A, 21B, 22A, 22B, 23A, 23B, and 24 illustrate a wafer at various stages of the method in FIGS. 1A and 1B according to some embodiments of the present disclosure.

FIGS. 2 to 24 illustrate a wafer W at various stages of the method M according to some embodiments of the present disclosure. The method M begins at block S10 where a pad layer, a mask layer and a photoresist layer are formed in sequence over a substrate. Referring to FIG. 2, in some embodiments of block S10, a wafer W undergoes a series of deposition and photolithography processes, such that a pad layer 120, a mask layer 130 and a patterned photoresist layer 140 are formed on a substrate 110 of the wafer W. In some embodiments, the substrate 110 is a semiconductor substrate, such as a bulk semiconductor, a semiconductor-on-insulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the pad layer 120 is a thin film including silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photoresist layer 140 is formed on the mask layer 130 and is then patterned, forming openings in the photoresist layer 140, so that regions of the mask layer 130 are exposed.

Figure 3:
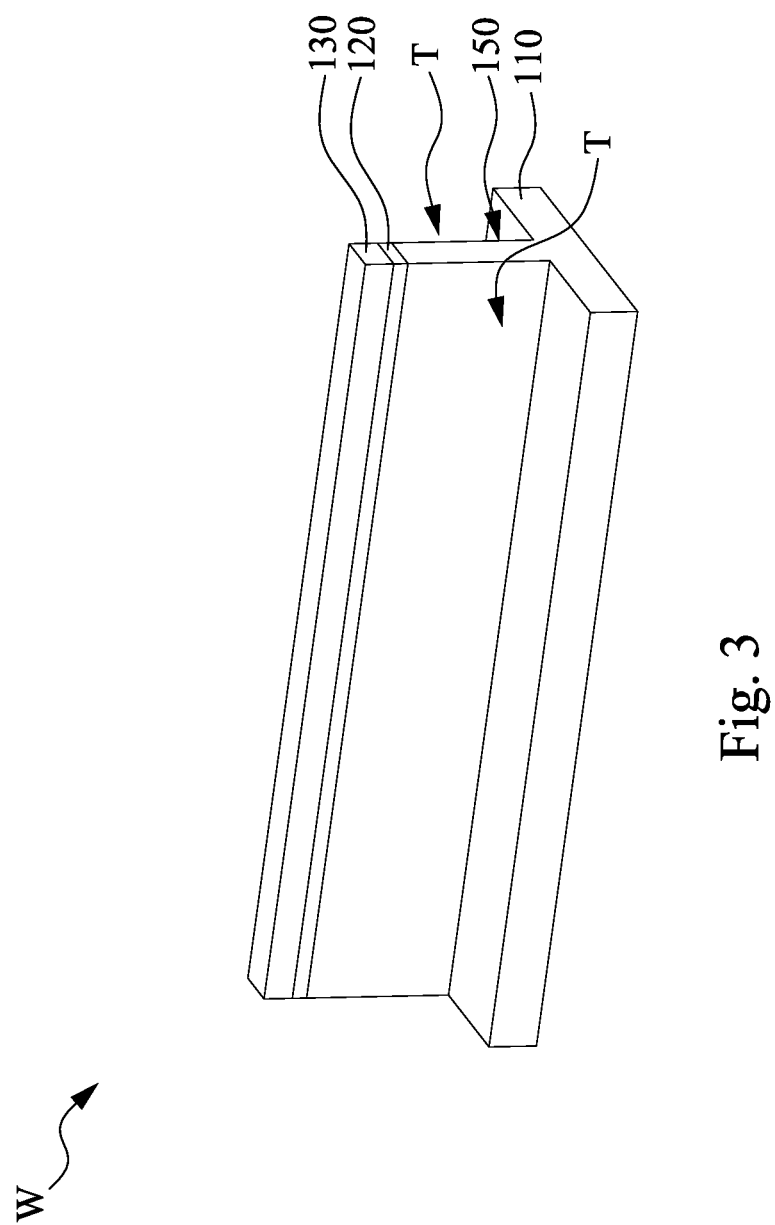

Returning to FIG. 1A, the method M then proceeds to block S11 where the substrate is patterned to form one or more fins. With reference to FIG. 3, in some embodiments of block S11, the mask layer 130 and pad layer 120 are etched through the photoresist layer 140, exposing underlying substrate 110. The exposed substrate 110 is then etched, forming trenches T. A portion of the substrate 110 between neighboring trenches T can be referred to as a fin 150. After etching the substrate 110, the photoresist layer 140 is removed. Next, a cleaning step may be optionally performed to remove a native oxide of the semiconductor substrate 110. The cleaning may be performed using diluted hydrofluoric (HF) acid, for example.

Figure 4:
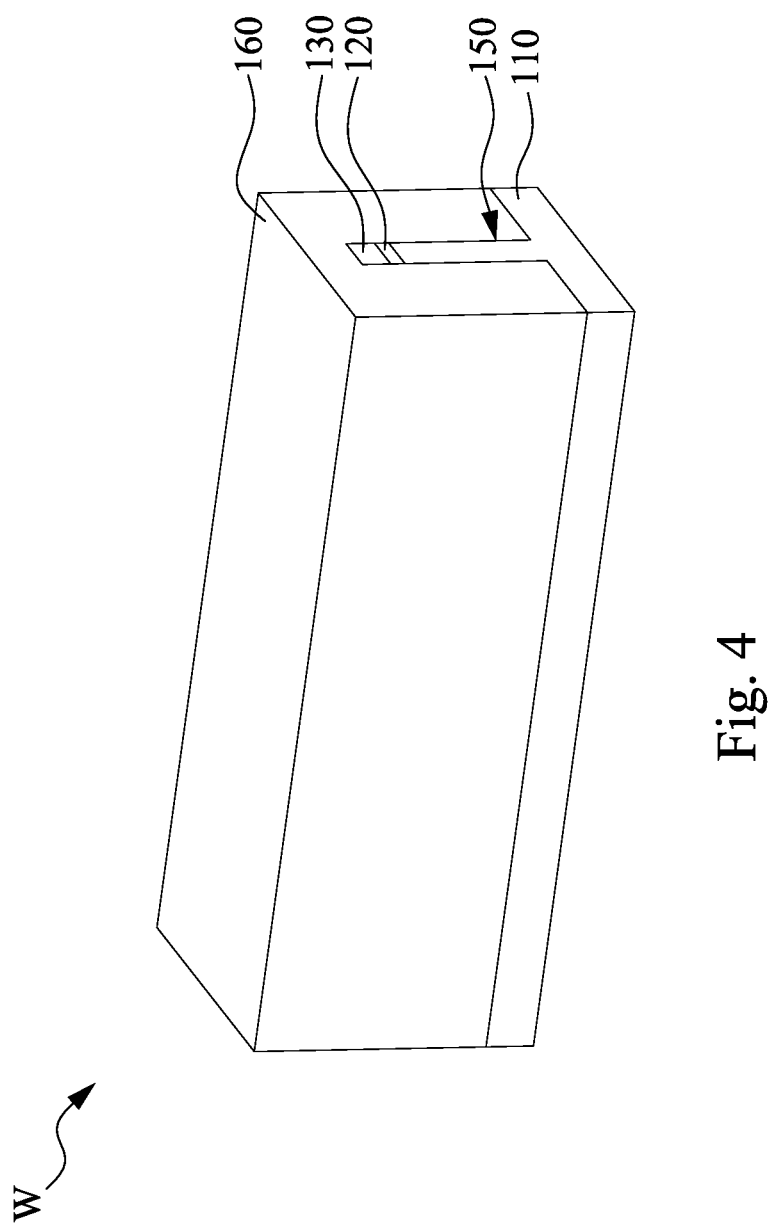

Returning to FIG. 1A, the method M then proceeds to block S12 where an isolation dielectric is formed to cover the fin. With reference to FIG. 4, an isolation dielectric 160 is formed to overfill the trenches and cover the fin 150. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 5:
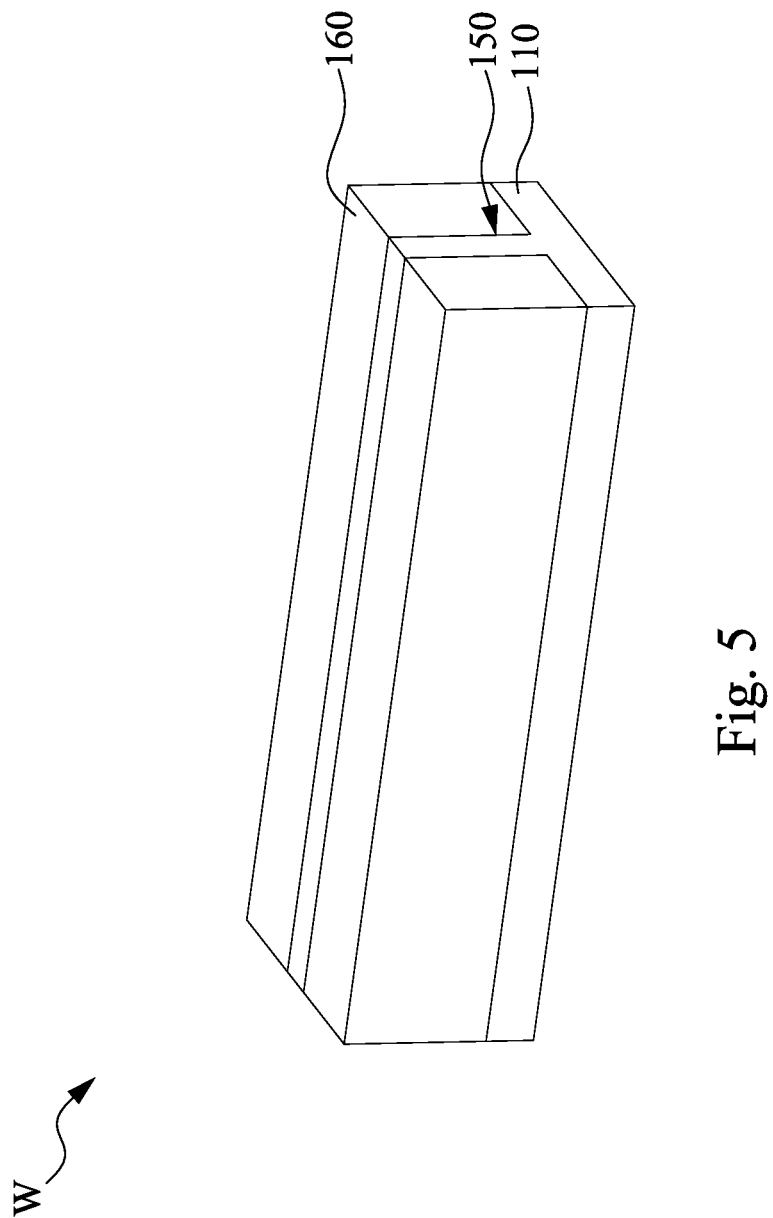

Returning to FIG. 1A, the method M then proceeds to block S13 where a planarization process is performed to the isolation dielectric. With reference to FIG. 5, a planarization process such as chemical mechanical polish (CMP) is performed to remove the excess isolation dielectric 160 over the fin 150. In some embodiments, the planarization process may also remove the mask layer 130 and the pad layer 120 such that a top surface of the fin 150 is exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 6:
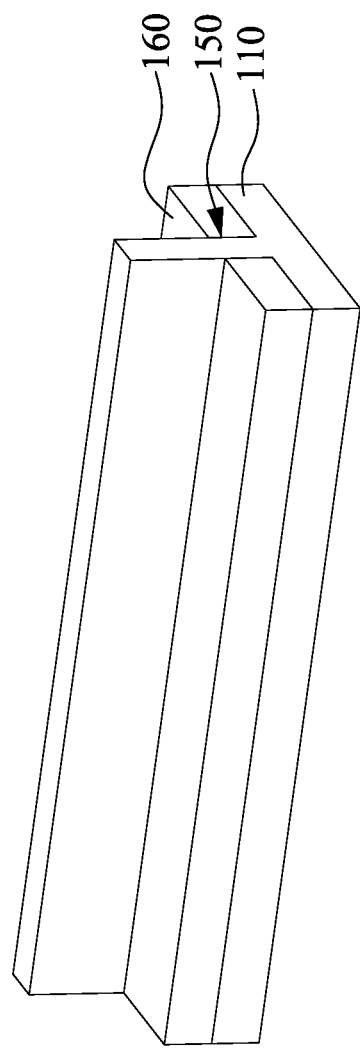

Returning to FIG. 1A, the method M then proceeds to block S14 where the isolation dielectric is recessed. With reference to FIG. 6, the isolation dielectric 160 is recessed, for example, through an etching operation, in which diluted HF, SiCoNi (including HF and $NH_3$), or the like, may be used as the etchant. After recessing the isolation dielectric 160, a portion of the fin 150 is higher than a top surface of the isolation dielectric 160.

It is understood that the blocks S10-S14 described above are merely an example of how the fin 150 and the STI structure 160 are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. For example, the semiconductor fin 150 can be recessed, and a material different from the recessed semiconductor fin 150 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 150 may include silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, or the like.

Figure 7:
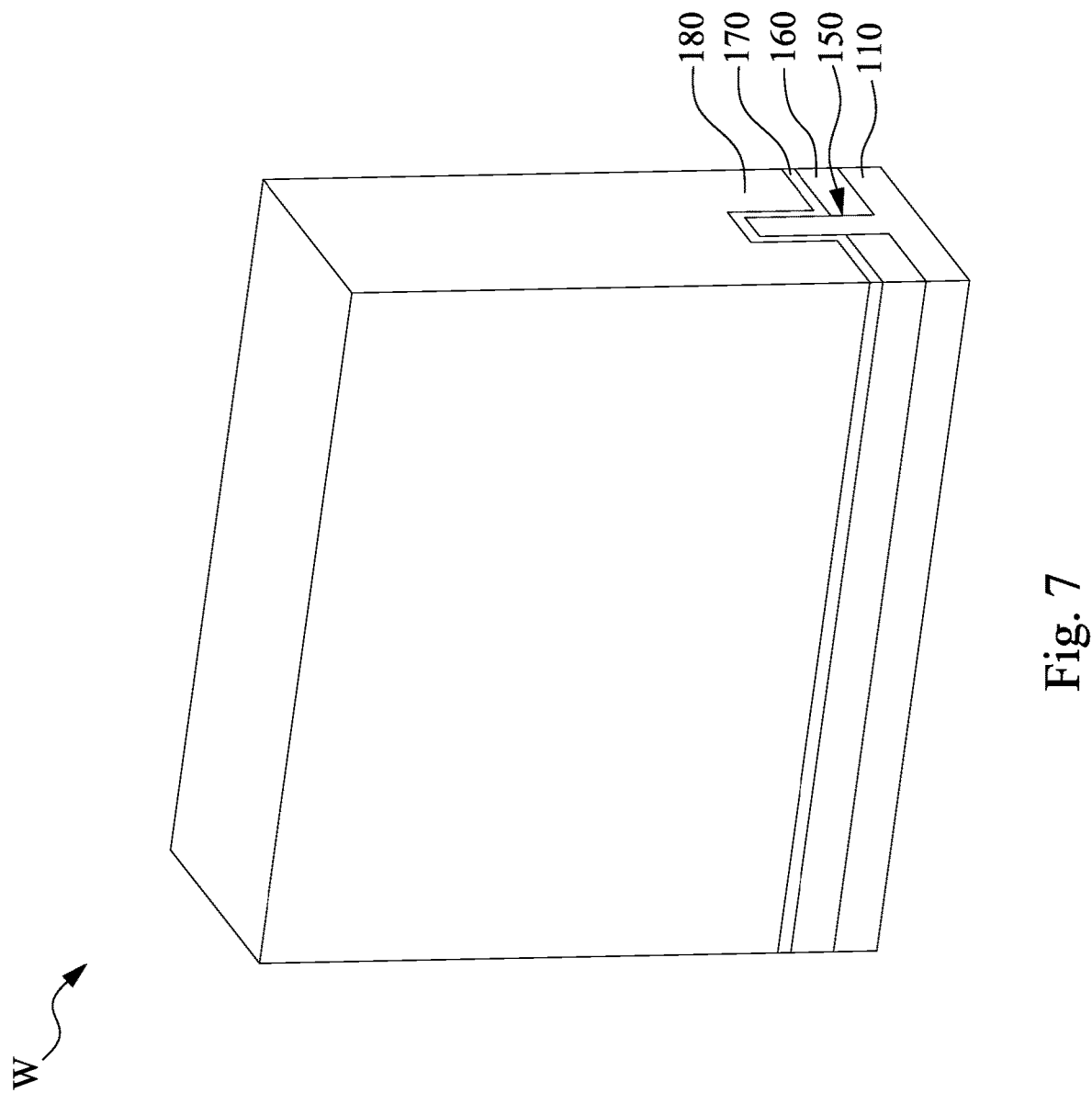

Returning to FIG. 1A, the method M then proceeds to block S15 where a gate dielectric layer and a dummy gate electrode layer are formed in sequence over the fin. With reference to FIG. 7, a gate dielectric layer 170 is blanket formed over the substrate 110 to cover the semiconductor fin 150 and the isolation dielectric 160, and a dummy gate electrode layer 180 is formed over the gate dielectric layer 170. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

In some embodiments, the dummy gate electrode layer 180 may include polycrystalline-silicon (poly-Si), polycrystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 8:
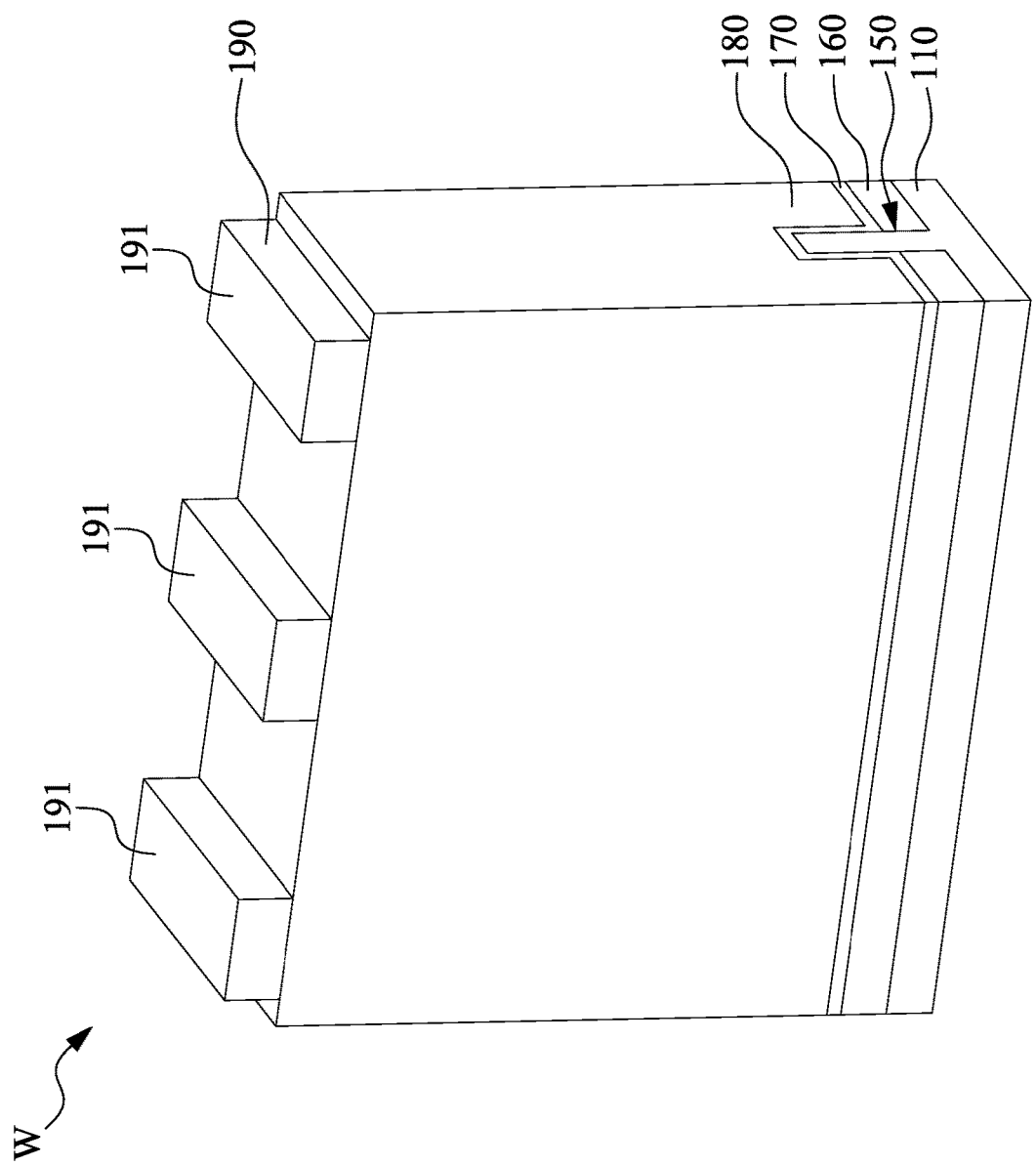

Returning to FIG. 1A, the method M then proceeds to block S16 where a patterned mask layer is formed over the dummy gate electrode layer. With reference to FIG. 8, in some embodiments of block S16, a patterned mask layer 190 is formed over the dummy gate electrode layer 180 and then patterned to form separated mask portions. The patterned mask layer 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 9:
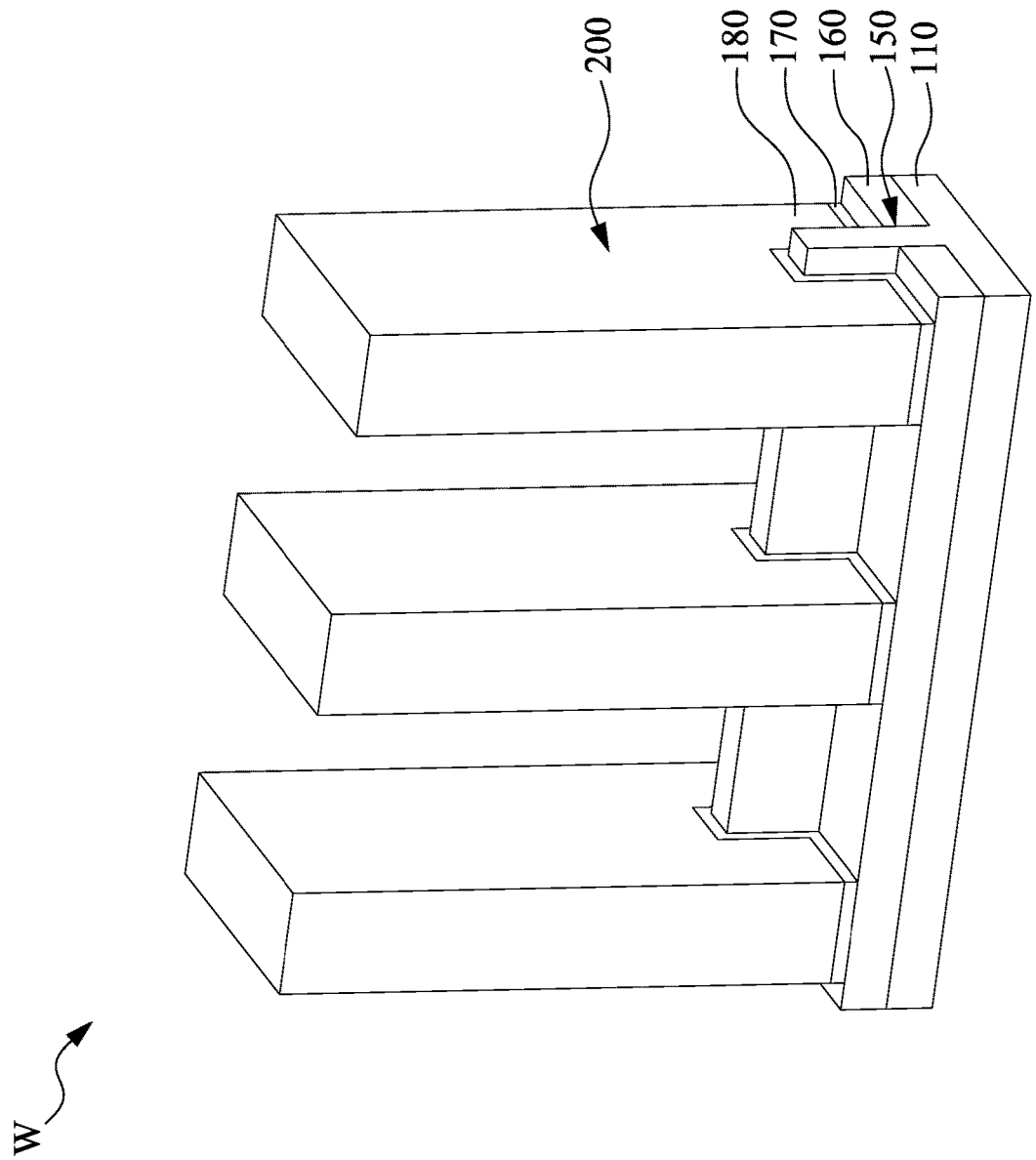

Returning to FIG. 1A, the method M then proceeds to block S17 where the dummy gate electrode layer and the gate dielectric layer are patterned to form dummy gate structures. With reference to FIG. 9, in some embodiments of block S17, one or more etching processes are performed to form dummy gate structures 200 wrapping around the semiconductor fin 150 using the patterned mask 190 as an etching mask, and the patterned mask layer 190 is removed after the etching. Each dummy gate structure includes a gate dielectric layer 170 and a dummy gate electrode layer 180 over the gate dielectric layer 170. The dummy gate structures 200 have substantially parallel longitudinal axes that are substantially perpendicular to a longitudinal axis of the semiconductor fin 150. The dummy gate structures 200 will be replaced with a replacement gate structure using a "gate-last" or replacement-gate process.

Figure 10:
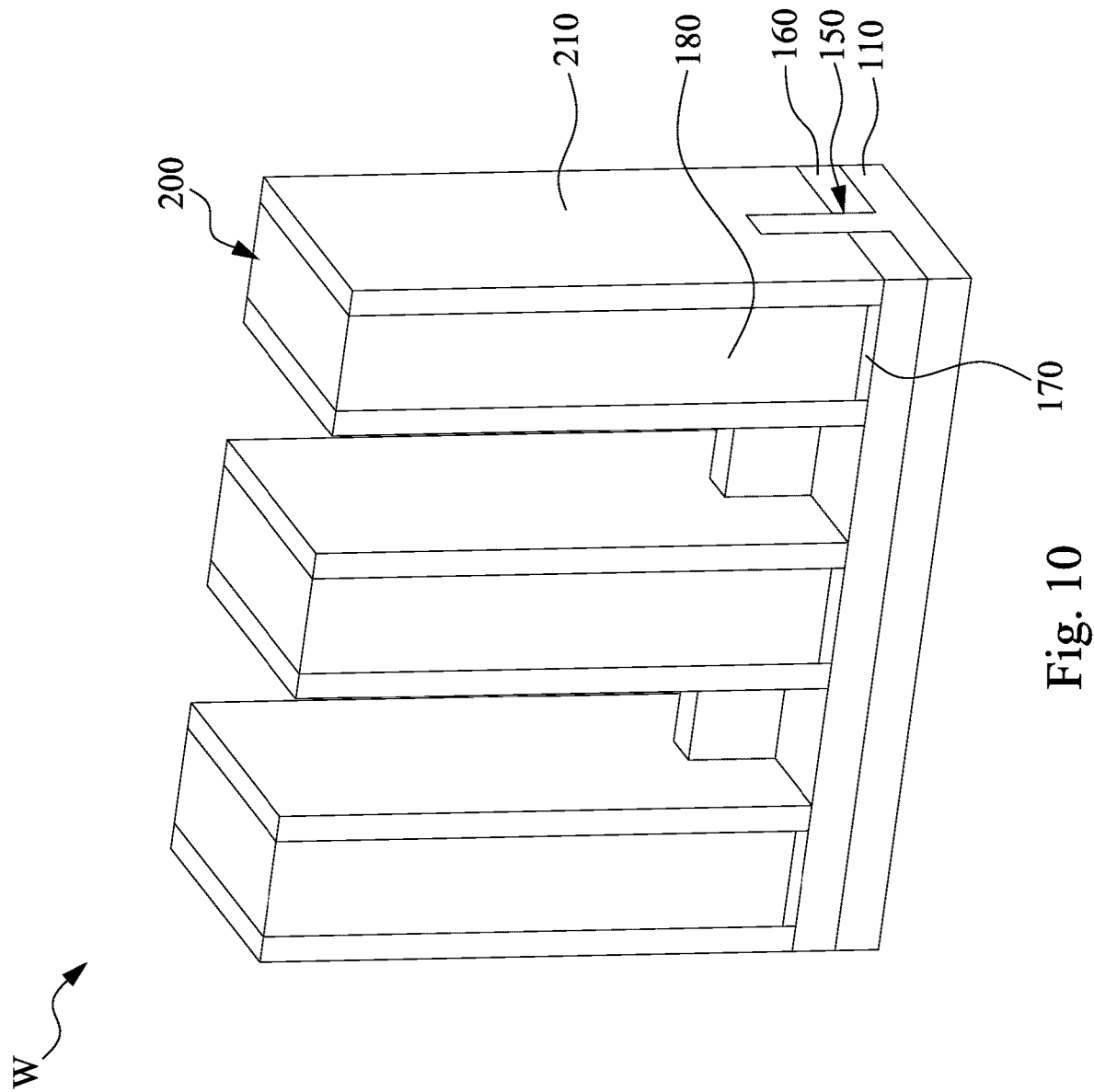

Returning to FIG. 1A, the method M then proceeds to block S18 where gate spacers are formed along sidewalls of the dummy gate structures. With reference to FIG. 10, in some embodiments of block S18, gate spacers 210 are formed along sidewalls of the dummy gate structures 200. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 210 may include a single layer or multilayer structure made of different dielectric materials. The method of forming the gate spacers 210 includes blanket forming a dielectric layer on the structure shown in FIG. 9 using, for example, CVD, PVD or ALD, and then performing an etching process such as anisotropic etching to remove horizontal portions of the dielectric layer. The remaining portions of the dielectric layer on sidewalls of the dummy gate structures 200 can serve as the gate spacers 210. In some embodiments, the gate spacers 210 may be used to offset subsequently formed doped regions, such as source/drain regions. The gate spacers 210 may further be used for designing or modifying the source/drain region profile.

Figure 11:
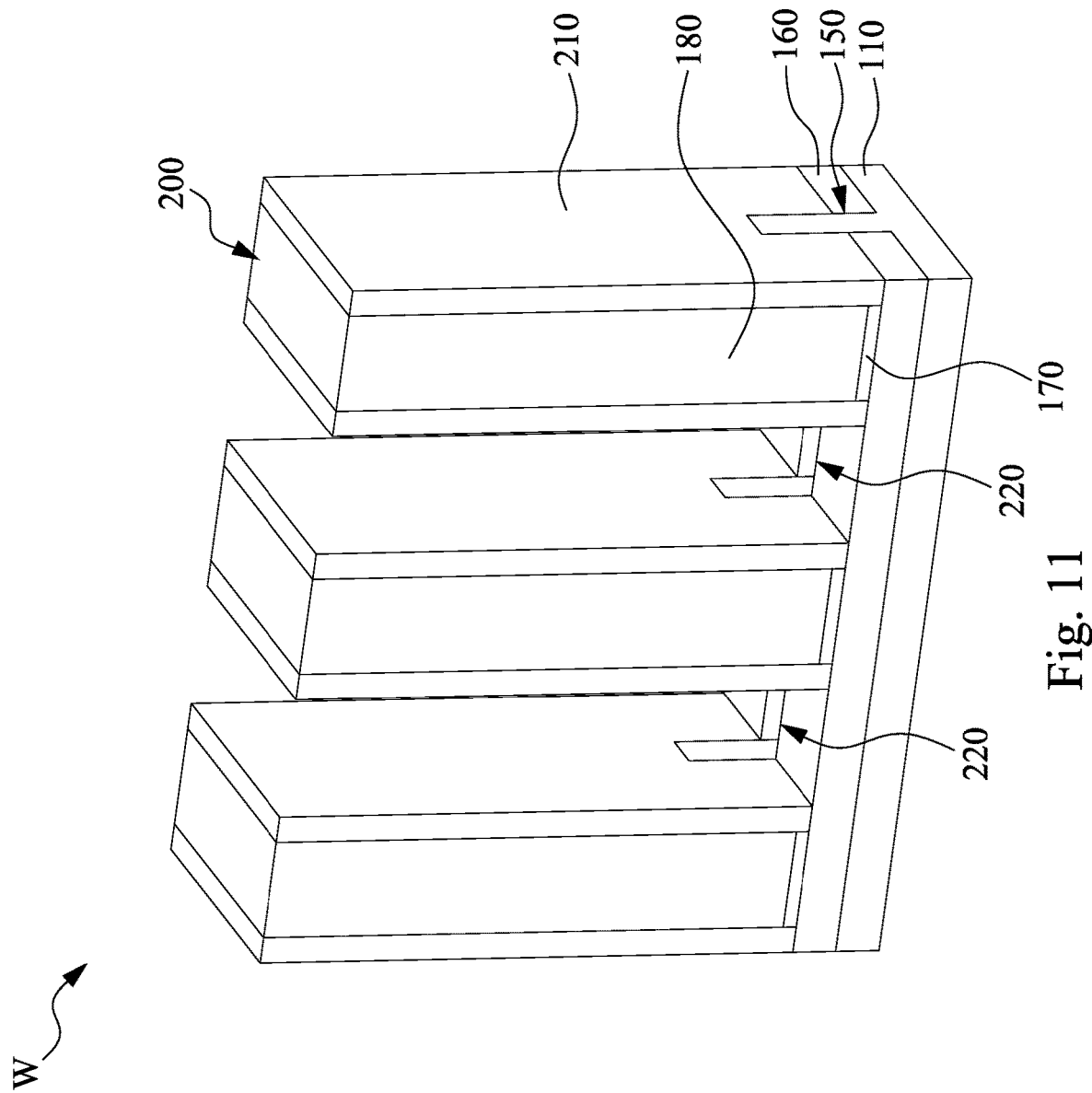

Referring to FIG. 1A, the method M then proceeds to block S19 where source/drain recesses are formed into the fin. With reference to FIG. 11, in some embodiments of block S19, portions of the semiconductor fin 150 not covered by the dummy gate structures 200 and the gate spacers 210 are recessed to form recesses 220.

Formation of the recesses 220 may include a dry etching process, a wet etching process, or combination dry and wet etching processes. This etching process may include reactive ion etch (RIE) using the dummy gate structures 200 and gate spacers 210 as masks, or by any other suitable removal process. After the etching process, a pre-cleaning process may be performed to clean the recesses 220 with hydrofluoric acid (HF) or other suitable solution in some embodiments.

Figure 12:
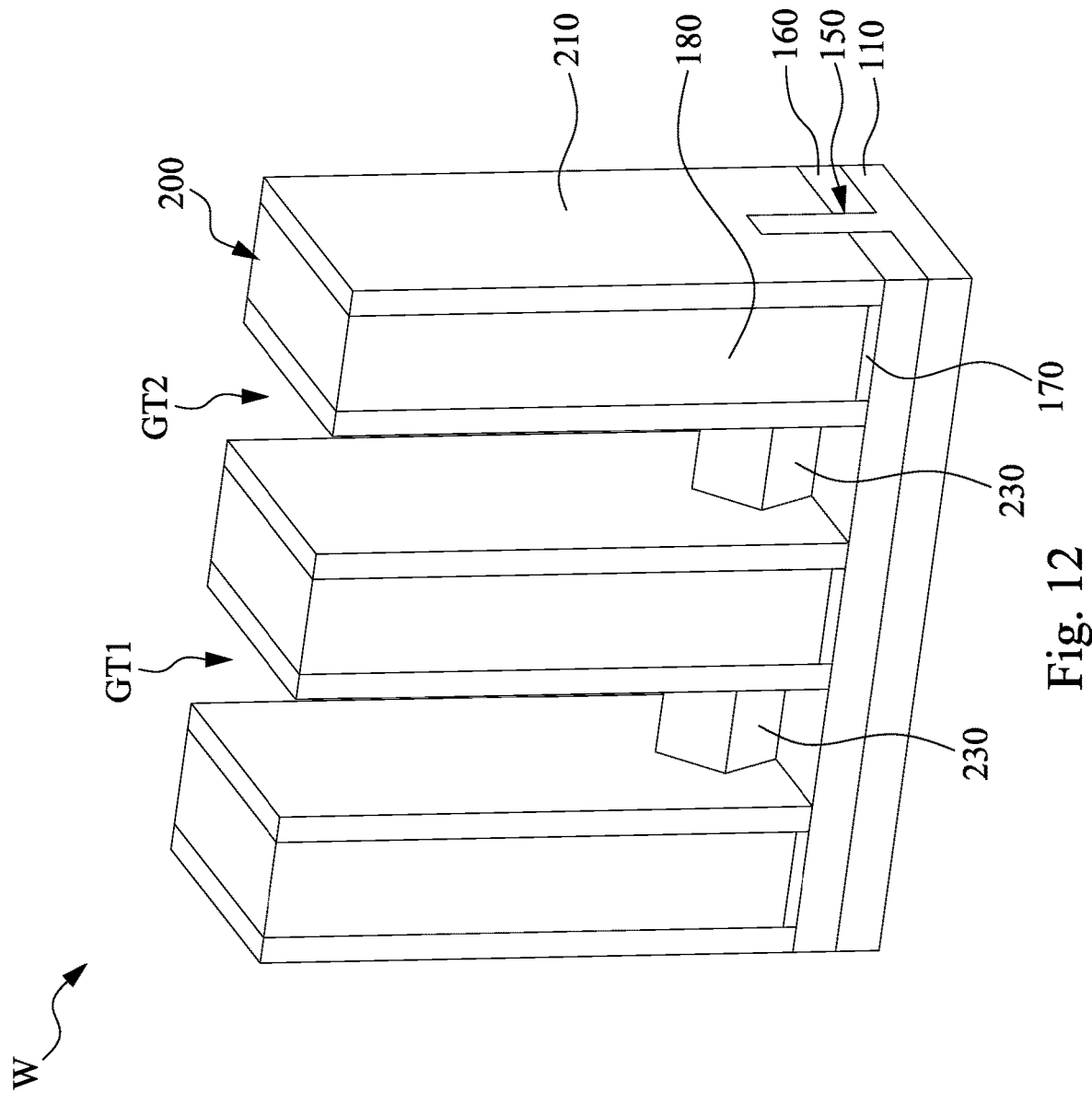

Returning to FIG. 1B, the method M then proceeds to block S20 where source/drain structures are formed into the recesses. With reference to FIG. 12, in some embodiments of block S20, epitaxial source/drain structures 230 are respectively formed in the recesses 220 (see FIG. 11). The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 150. In some embodiments, lattice constants of the epitaxial source/drain structures 230 are different from that of the semiconductor fin 150, so that the channel region between the epitaxial source/drain structures 230 can be strained or stressed by the epitaxial source/drain structures 230 to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 150 (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, an implantation process is performed to dope the epitaxial source/drain structures 230. One or more annealing processes may be performed to activate the epitaxial source/drain structures 230. The annealing processes include rapid thermal annealing (RTA) and/or laser annealing processes.

Figure 13:
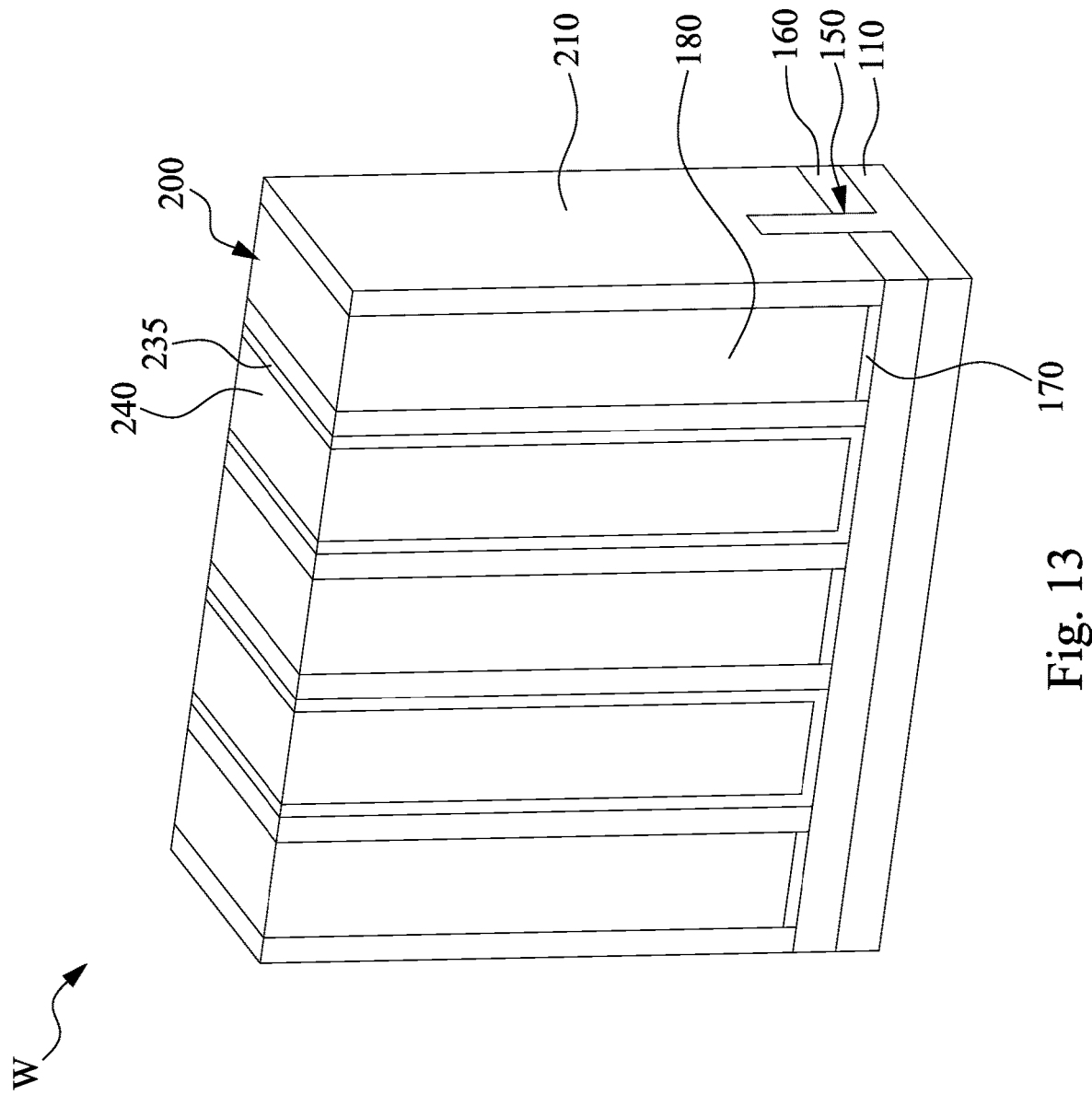

Returning to FIG. 1B, the method M then proceeds to block S21 where a contact etch stop layer (CESL) and an interlayer dielectric (ILD) layer is formed over the source/drain structures. With reference to FIG. 13, in some embodiments of block S21, a CESL 235 is formed over the source/drain structures 230, the dummy gate structures 200 and the gate spacers 210, and an ILD layer 240 is formed over the CESL 235, followed by performing a CMP process to remove excessive material of the ILD layer 240 and CESL 235 to expose the dummy gate structures 200. The CMP process may planarize a top surface of the ILD layer 240 with top surfaces of the dummy gate structures 200 and gate spacers 210. In some embodiments, the ILD layer 240 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 240 may be formed using, for example, CVD, ALD, spin-on-glass (SOG) or other suitable techniques. In some embodiments, the CESL 235 includes silicon nitride, silicon oxynitride or other suitable materials. The CESL 235 can be formed using, for example, plasma enhanced CVD, low pressure CVD, ALD or other suitable techniques.

Figure 14:
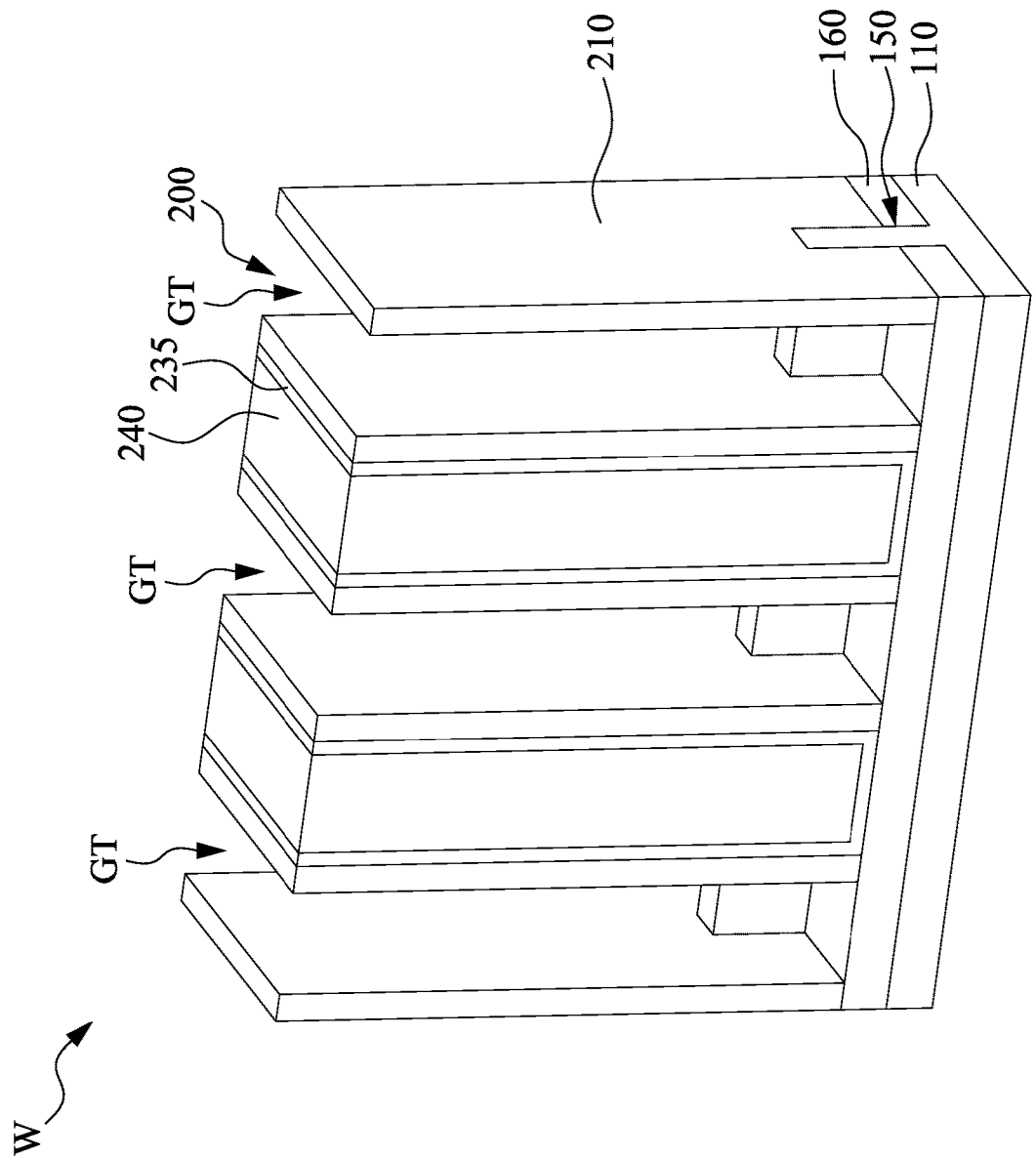

Returning to FIG. 1B, the method M then proceeds to block S22 where the dummy gate structures are removed to form gate trenches. With reference to FIG. 14, in some embodiments of block S22, dummy gate structures 200 (as shown in FIG. 13) are removed to form gate trenches GT with the gate spacers 210 as their sidewalls. Widths of the gate trenches GT are associated with the corresponding dummy gate structures 200. In some embodiments, the dummy gate structures 200 are removed by performing a first etching process and performing a second etching process after the first etching process. In some embodiments, the dummy gate electrode layer 180 (as shown in FIG. 13) is mainly removed by the first etching process, and the gate dielectric layer 170 (as shown in FIG. 13) is mainly removed by the second etching process that employs a different etchant than that used in the first etching process. In some embodiments, the dummy gate electrode layer 180 is removed, while the gate dielectric layer 170 remains in the gate trenches GT.

Figure 15A:
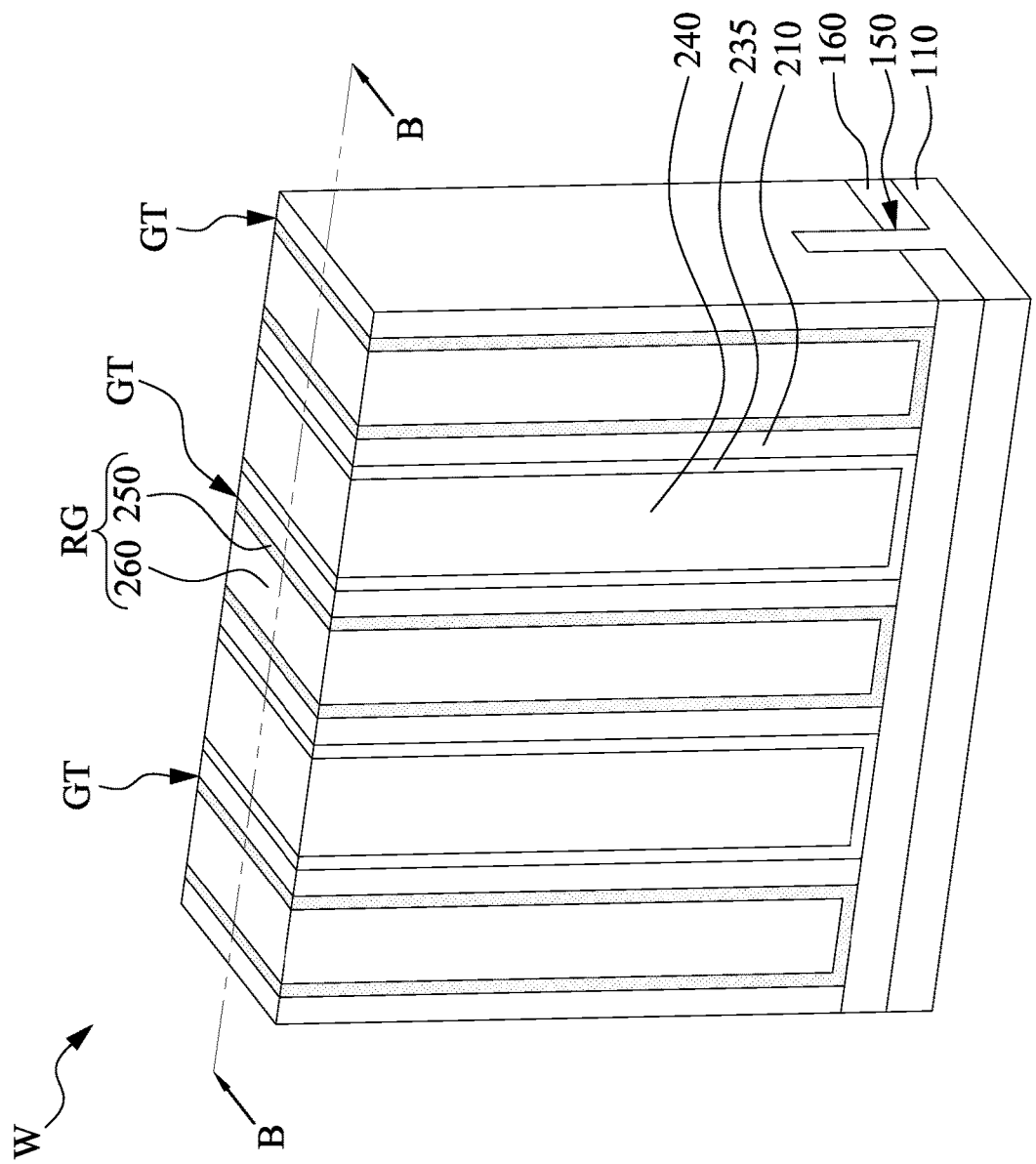
Figure 15B:
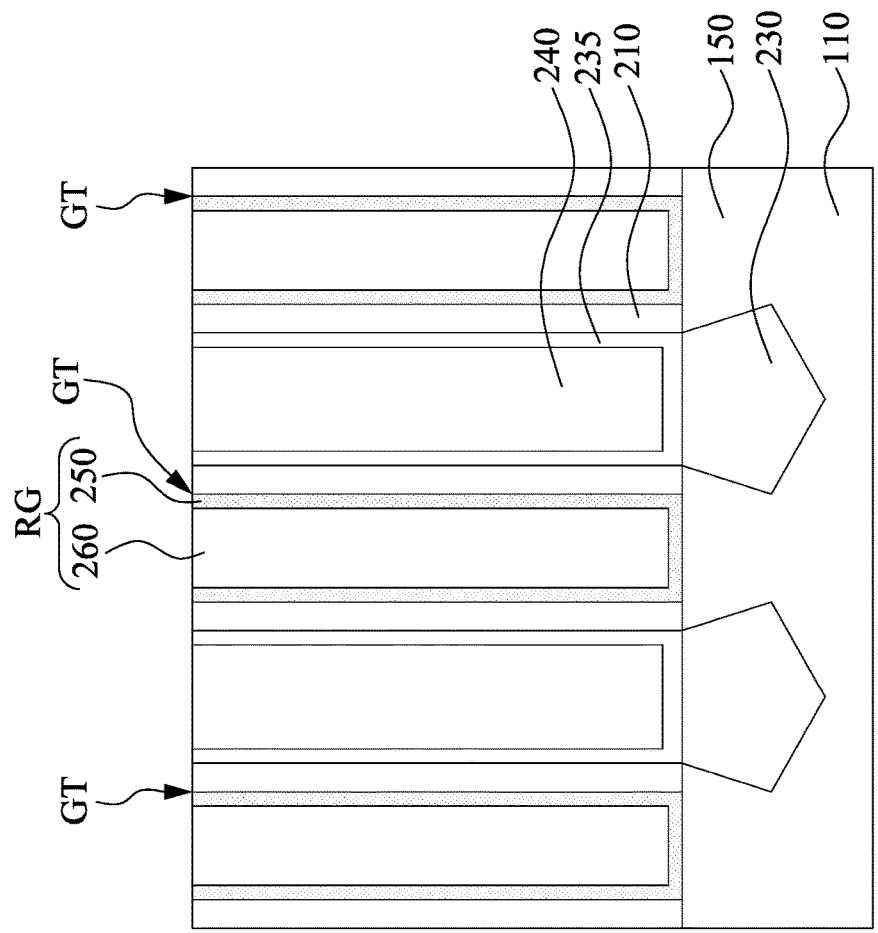

Returning to FIG. 1B, the method M then proceeds to block S23 where gate structures are formed in gate trenches. Reference is made to FIGS. 15A and 15B, in which FIG. 15B is a cross-sectional view taking along line B-B in FIG. 15A. In some embodiments of block S23, replacement gate structures RG are respectively formed in the gate trenches GT (as shown in FIG. 14).

An exemplary method of forming these replacement gate structures may include blanket forming a gate dielectric layer over the wafer W, forming one or more work function metals over the blanket gate dielectric layer, and performing a CMP process to remove excessive materials of the one or more work function metals and the gate dielectric layer outside the gate trenches GT. As a result of this method, the replacement gate structures RG each include a gate dielectric layer 250 and a work function metal 260 wrapped around by the gate dielectric layer 250.

In some embodiments, the gate dielectric layer 250 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 250 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 250 may have a multilayer structure such as one layer of silicon oxide (e.g., interfacial layer) and another layer of high-k material. In some embodiments, the gate dielectric layer 250 is made of the same material because they are formed from the same dielectric layer blanket deposited over the substrate 110.

The work function metal 260 includes suitable work function metals to provide suitable work functions. In some embodiments, the work function metal 260 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metal 260 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals 260 are made of different work function metals so as to achieve suitable work functions in some embodiments. In some embodiments, an entirety of the work function metal 260 is a work function metal.

In some embodiments, the term "work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid surface on the macroscopic scale.

Returning to FIG. 1B, block S24 in the method M is directed to a metal gate etching back (MGEB) process according to some embodiments of the present disclosure. In the present disclosure, the MGEB process is a plasma etching process employing one or more etchants such as a chlorine-containing gas (e.g., $Cl_2$, $CHCl_3$, $CCl_4$, $BCl_3$, and/or $SCl_4$), a bromine-containing gas (e.g., hydrogen bromide (HBr)), and/or a fluorine-containing gas (e.g., $CF_4$, $SF_6$, $CH_2F_2$, $CHF_3$, and/or $C_2F_6$).

Figure 27B:
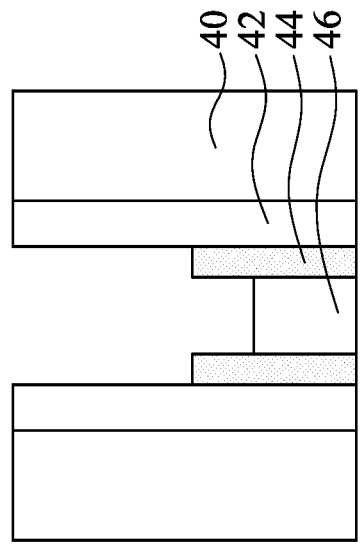
Figure 27A:
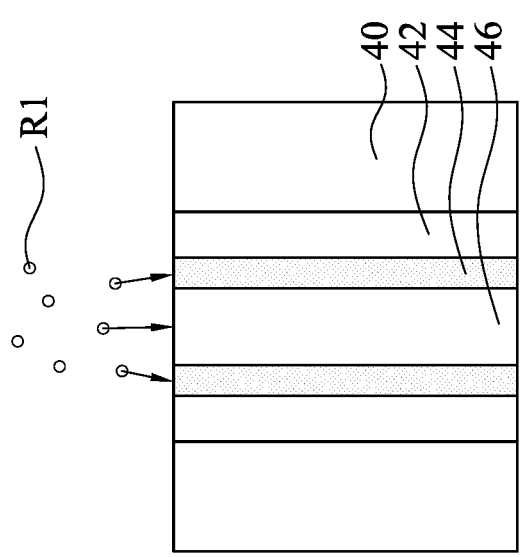

FIGS. 27A-27G are schematic cross-sectional views of a wafer during a metal gate etch back (MGEB) process according to some embodiments of the present disclosure. Referring is made to FIGS. 27A and 27B. Plasmas are partially ionized gas mixtures where a fraction of the atoms or molecules have lost an electron to produce positively charged ions. Electric and magnetic fields can be used to create plasmas and to control their behavior. Plasmas are generated through dissipation of the electrical power supplied to a gas mixture. The power is transferred to electrons and such energetic electrons then undergo collisions with atoms and molecules of the mixture to produce ions, more electrons and radicals by initiating processes such as ionization, excitation and dissociation. Electron impact can ionize an atom or molecule in the plasma or dissociate a molecule producing free radicals. Free radicals may recombine with appropriate gas phase species to reproduce the state they originated from or create other species.

By way of example, the plasma etching process used in the MGEB process as shown in FIGS. 27A and 27B uses a reactant gas R1 including an argon (Ar) gas, a boron trichloride ($BCl_3$) gas, a $Cl_2$ gas, and the like. Electron impact dissociation of $BCl_3$ produces $BCl_n$ radicals (n=1 or 2) and chlorine radicals to selectively etch a gate dielectrics 44 and a work function metal 46, in which the gate dielectrics 44 and the work function metal 46 are embedded in an ILD layer 40 and between gate spacers 42. Moreover, some chlorine radicals recombine with $BCl_n$ radicals to form $BCl_3$ gas. Further, the $BCl_n$ radicals may form $BCl_x$ polymers (x is a positive integer). Formation of the $BCl_x$ polymers is equivalently referred to as "polymerization." Conditions of the plasma etching process are tuned such that etching phenomenon is dominant over polymerization phenomenon in a plasma chamber. In some embodiments, material and manufacturing method of the gate dielectric 44, the work function metal 46, the ILD layer 40, and the gate spacers 42 may be substantially the same as that of the gate dielectric layer 250, work function metal 260, the ILD layer 240, and the gate spacers 210 as shown in FIGS. 10-15B, and the related detailed descriptions may refer to the foregoing paragraphs, and are not described again herein.

In some embodiments where $HfO_2$ is used as the gate dielectrics 44, an example etching mechanism of the $HfO_2$ in Ar/$BCl_3$/$Cl_2$ plasmas is described as follows. For example, Hf—O bond breaking is the first step followed by Cl adsorption by Hf atoms that produces solid $HfCl_x$ and $BCl_x$ adsorption by bond cleaved O that generated solid $B_mOCl_n$. Later $HfCl_x$ and $B_mOCl_n$ solids are etched as volatile $HfCl_x$ (x=2-4), $BOCl$, $B_2OCl_3$ and $B_2OCl_4$ by ion impact reactions.

In some embodiments where TiN is used as work function metal 46, an example etching mechanism of TiN in Ar/$BCl_3$/$Cl_2$ plasmas is described as follows. For example, TiN etching begins with ion bombardment to break Ti—N bonds and liberate N atoms. The Ti site then absorbs Cl leading to formation of $TiCl_n$ (n=1-3) on a surface of the TiN layer. Ion bombardment removes these compounds as $TiCl_n$ gas. TiN surface can itself absorb Cl to produce TiNCl on the surface of TiN layer, followed by energetic ion bombardment containing Cl to remove Ti from TiNCl as volatile $TiCl_n$ gas.

In some embodiments where TaN is used as work function metal 46, an example etching mechanism of TaN in Ar/$BCl_3$/$Cl_2$ plasmas is described as follows. For example, TaN etching begins with ion bombardment to break Ta—N bonds and liberate N atoms. The Ta site then absorbs Cl leading to formation of $TaCl_n$ (n=1-3) on a surface of the TaN layer. Ion bombardment removes these compounds as $TaCl_n$ gas. TaN surface can itself absorb Cl to produce TaNCl on the surface of TaN layer, followed by energetic ion bombardment containing Cl to remove Ta from TaNCl as volatile $TaCl_n$ gas.

During the MGEB process by using the reactant gas R1, a ratio of a removal rate (i.e., etch rate) of the work function metal 46 to a removal rate of the gate dielectric 44 is greater than about 5. Therefore, after the MGEB process by using the reactant gas R1, a top surface of the work function metal 46 is lower than a top surface of the gate dielectric 44. In some embodiment, a distance between a top surface of the work function metal 46 and a top surface of the gate dielectric 44 is greater than about 4 nm.

Referring is made to FIGS. 27C, 27D, and 27E. By way of example, the plasma etching process used in the MGEB process further uses a reactant gas R2 including an argon (Ar) gas, an HBr gas, and the like. In some embodiments, the MGEB process is performed using the reactant gas R2 simultaneously with the reactant gas R1.

As shown in FIGS. 27C and 27D, electron impact dissociation of bromine radicals to selectively etch the gate dielectrics and the work function metal 46. Moreover, some bromine radicals recombine with hydrogen radicals to form HBr gas.

In some embodiments where TiN is used as work function metal 46 as shown in FIG. 27C, an example a mechanism of TiN in Ar/HBr plasmas is described as follows. For example, an ion bombardment to break Ti—N bonds and liberate N atoms. The Ti site then absorbs Br leading to a protection layer 48 that is a formation of $TiBr_n$ (n=1-3) on a surface of the TiN layer. In some embodiments where TaN is used as work function metal 46, an example a mechanism of TaN in Ar/HBr plasmas is described as follows. For example, an ion bombardment to break Ta—N bonds and liberate N atoms. The Ta site then absorbs Br leading to the protection layer 48 that is a formation of $TaBr_n$ (n=1-3) on a surface of the TaN layer.

During the MGEB process by using the reactant gas R2, the protection layer 48 may remain on the work function metal 46, and thus can be used to avoid the work function metal 46 from being further etched during the plasma etching process of the reactant gas R2. That is, in some embodiments, the thickness of the work function metal 46 may be kept rather than further lowered during the MGEB process by using the reactant gas R2. In some embodiments, the MGEB process is performed using the reactant gas R2 simultaneously with the reactant gas R1. (e.g., a chlorine-containing gas, such as $BCl_3$) to thin down the gate dielectric 44. In some embodiments, the reactant gas R2 may be different from the reactant gas R1. In some embodiment, a ratio of the amount of the bromine-containing gas to the amount of the chlorine-containing gas is in a range from about 1.2:1 to about 1.8:1. The protection layer 48 forms on the work function metal 46 may prevent the work function metal 46 from being etched by the reactant gas R1. That is, in some embodiments, the thickness of the work function metals 46 may be kept rather than further lowered during the MGEB process by using the reactant gas R2 with the reactant gas R1.

As shown in FIGS. 27D and 27E, the MGEB process is performed by using the reactant gas R1 and the reactant gas R2 such that a portion of the gate dielectric 44 above the protection layer 48 may be removed. In some embodiments where $HfO_2$ is used as the gate dielectrics 44 as shown in FIG. 27D, an example etching mechanism of the $HfO_2$ in Ar/HBr plasmas of the reactant gas R2 is described as follows. For example, Hf—O bond breaking is the first step followed by Br adsorption by Hf atoms that produces solid $HfBr_x$. Later $HfBr_x$ solids are etched as volatile $HfBr_x$ (x=2-4) by ion impact reactions. In some embodiments, after the forming of the protection layer 48, the plasma etching process of the reactant gas R2 has a first removal rate of the protection layer 48 and a second removal rate of the gate dielectric 44, and a ratio of the first removal rate of the protection layer 48 to the second removal rate of the gate dielectric 44 is greater than about 5. In some embodiments, the plasma etching process of the reactant gas R1 has a third removal rate of the gate dielectric 44 greater than that of the plasma etching process of the reactant gas R2 to the gate dielectric 44.

In some embodiments, after performing the MGEB process by using the reactant gas R2, a top surface of the protection layer 48 is substantially coplanar with a top surface of the gate dielectric 46. Accordingly, after performing after performing the MGEB process by using the reactant gas R2, a top surface of the work function metal 46 is lower than a top surface of the gate dielectric layer 44, and a distance between the top surface of the work function metal 46 and the top surface of the gate dielectric 44 is less than about 1 nm. As such, when a gate contact lands on the top surface of the work function metal 44, it may reduce the chance that the gate contact formed thereafter may be in contact with the gate dielectric 44 which in turn adversely affects the performance of the semiconductor device.

Figure 27G:
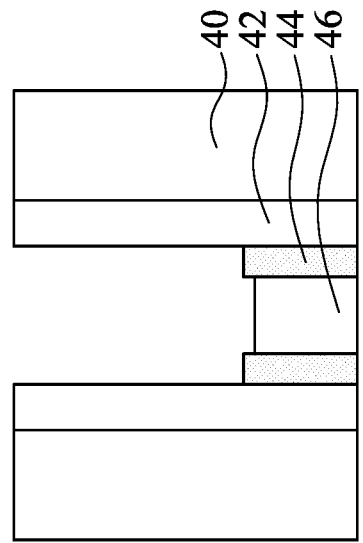
Figure 27F:
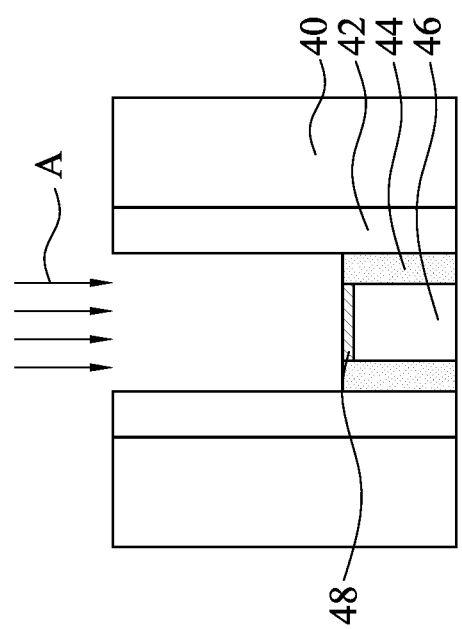

As shown in FIGS. 27F and 27G, the MGEB process is performed to remove the protection layer 48. In some embodiments, an ashing process A is performed to remove the protection layer 48 from the surface of the work function metal 46. The protection layer 48 may be removed by for example, ashing in an oxygen ($O_2$) plasma and wet-etch solution including $H_2SO_4/H_2O_2$. In some embodiments, a distance between a top surface of the gate dielectric 44 and a top surface of the work function metal 46 is less than about 1 nm.

Figure 28:
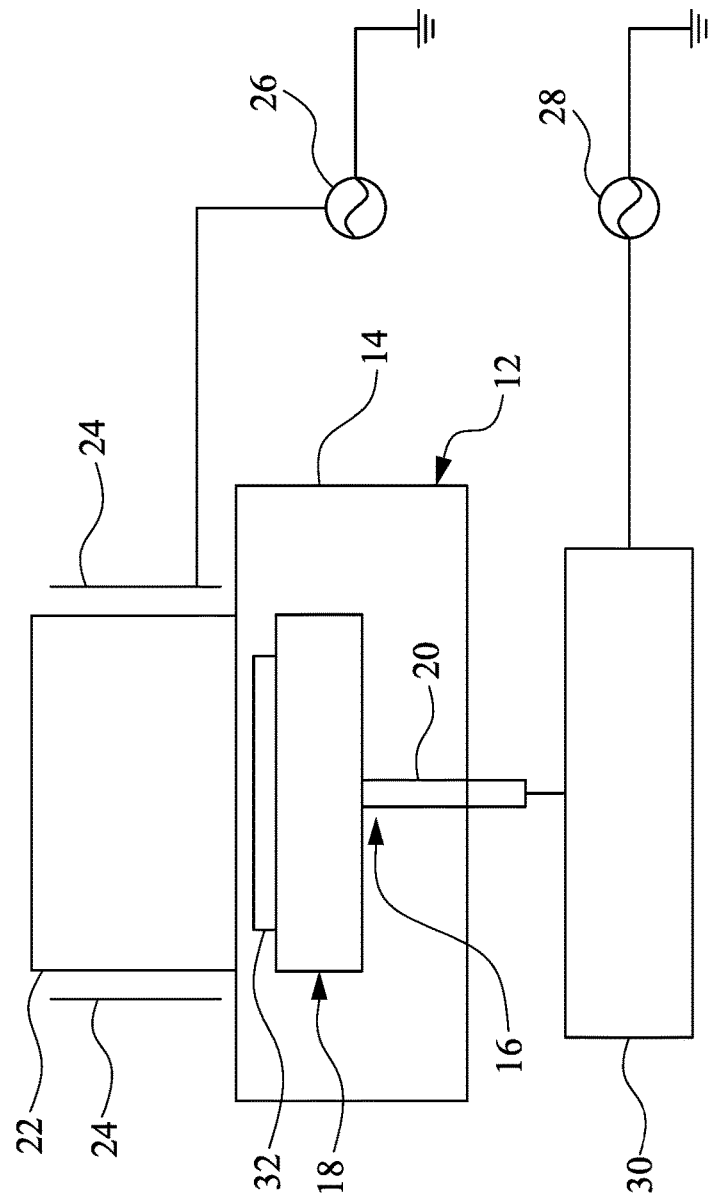
FIG. 28 is a cross-sectional view of a plasma processing apparatus in accordance with some embodiments of the present disclosure.

In certain embodiments of the present disclosure, the MGEB process is a multi-step plasma etching process involving a non-zero bias etching step and a zero-bias etching step in-situ performed in the same plasma process apparatus (i.e. performed in the same chamber). In greater detail, Referring now to FIG. 28, illustrated is a cross-sectional view of an exemplary plasma processing apparatus 10 in some embodiments of the present disclosure. In some embodiments, the plasma processing apparatus 10 may contain an inductively-coupled plasma (ICP) as a plasma source and a RF power supply as a bias power source. As shown in FIG. 28, the plasma processing apparatus 10 includes a chamber base 12 having a grounded chamber wall 14. The chamber base 12 is closed by a removable lid or a cover 22 and contains a pedestal assembly 18 which can be raised and lowered on a shaft 20 by actuation of a pedestal lift assembly 16. An inductively-coupled plasma coil 24 surrounds the lid 22 and is connected to an RF source power supply 26. The pedestal assembly 18 is connected, through an RF match network 30 which matches impedances, to an RF power supply 28. During operation of the plasma processing apparatus 10, the pedestal assembly 18 supports a wafer 32 in the chamber base 12. A plasma-generating source gas, such as argon, is introduced into the plasma processing apparatus 10 by a gas supply (not shown). Volatile reaction products and unreacted plasma species are removed from the plasma processing apparatus 10 by a gas removal mechanism (not shown). Source power such as a high voltage signal, provided by the RF source power supply 26, is applied to the inductively-coupled plasma coil 24 to ignite and sustain a plasma in the plasma processing apparatus 10. Ignition of a plasma in the plasma processing apparatus 10 is accomplished primarily by electrostatic coupling of the inductively-coupled plasma coil 24 with the source gas, due to the large-magnitude voltage applied to the inductively-coupled plasma coil 24 and the resulting electric fields produced in the plasma processing apparatus 10. Once ignited, the plasma is sustained by electromagnetic induction effects associated with time-varying magnetic fields produced by the alternating currents applied to the inductively-coupled plasma coil 24. Through the RF power supply 28, the pedestal assembly 18 may be electrically biased to provide to the wafer 32 ion energies that are independent of the RF voltage applied to the chamber 10 through the inductively-coupled plasma coil 24 and RF source power supply 26. This facilitates more precise control over the energies of the etchant ions that bombard the surface of the wafer 32. A non-zero bias etching can be provided by the ICP plasma source 26 with turning on the RF power source 28 during the non-zero bias etching step. On the contrary, a zero bias can be provided by the ICP plasma source 26 without turning on the RF power source 28 during the zero bias etching step. The non-zero bias etching step and the zero bias etching step result in different profile of the etched gate structures, as will be discussed further below. In some embodiments, the non-zero bias power is in a range from about 10 W to about 300 W. If the bias power is higher than about 300 W, the plasma might result in unwanted damage to the ILD layer 240 shown in FIGS. 16A and 16B. In some embodiments, the plasma processing apparatus 10 may also be an electron cyclotron resonance (ECR) apparatus, but the present disclosure is not limited thereto.

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also be used to refer to processes in which the device or substrate being processed is not exposed to an external environment (e.g., external to the processing system).

In certain embodiments of block S24, with reference to FIGS. 16A-19B, the MGEB process is sequence etching processes. For example, it may perform a first etching step (e.g., FIGS. 16A and 16B) followed by a second etching step (e.g., FIGS. 17A-18B). In some embodiments, an ashing process (e.g., FIGS. 19A and 19B) may follow the sequence etching processes.

Figure 16A:
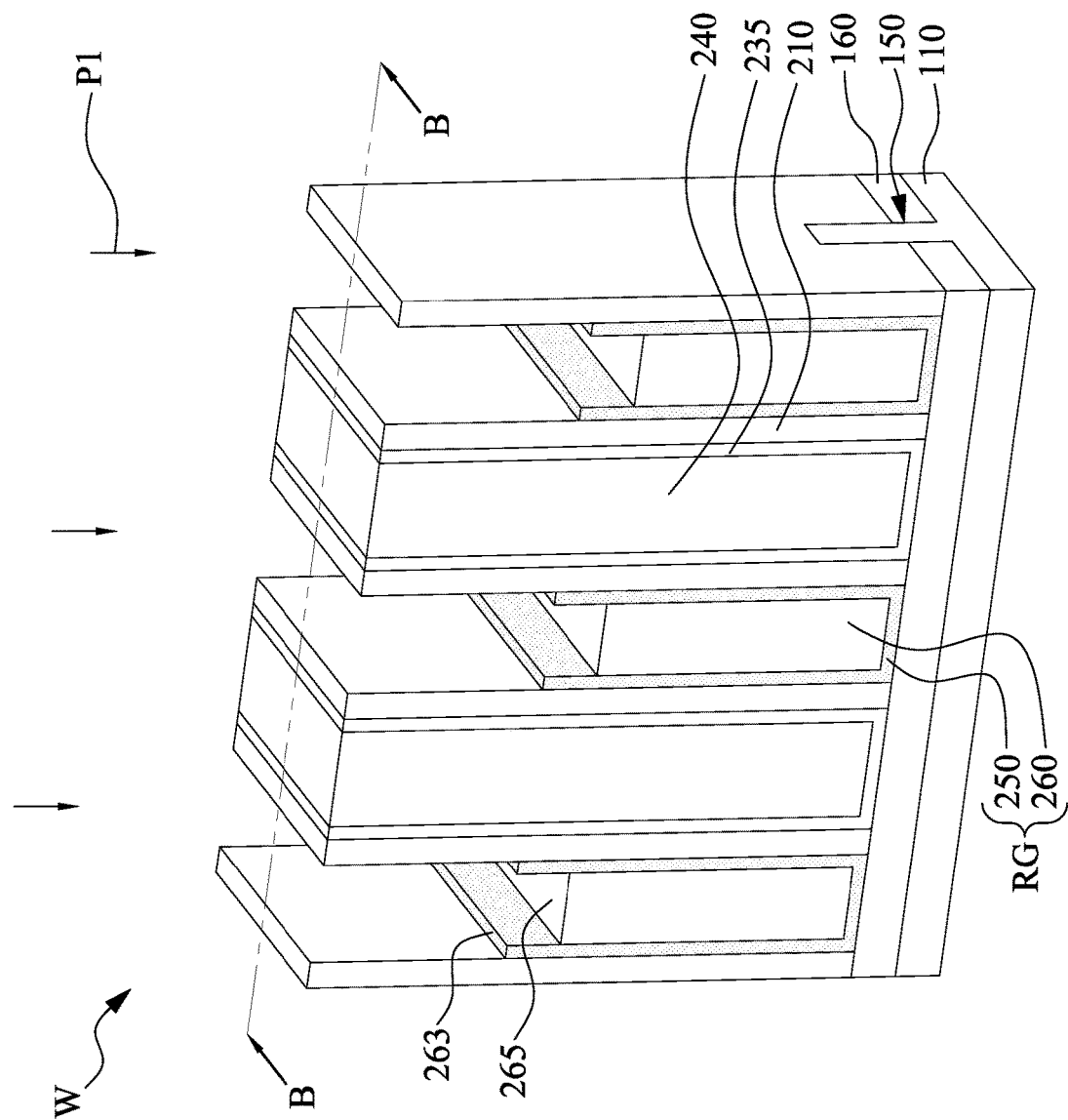
Figure 16B:
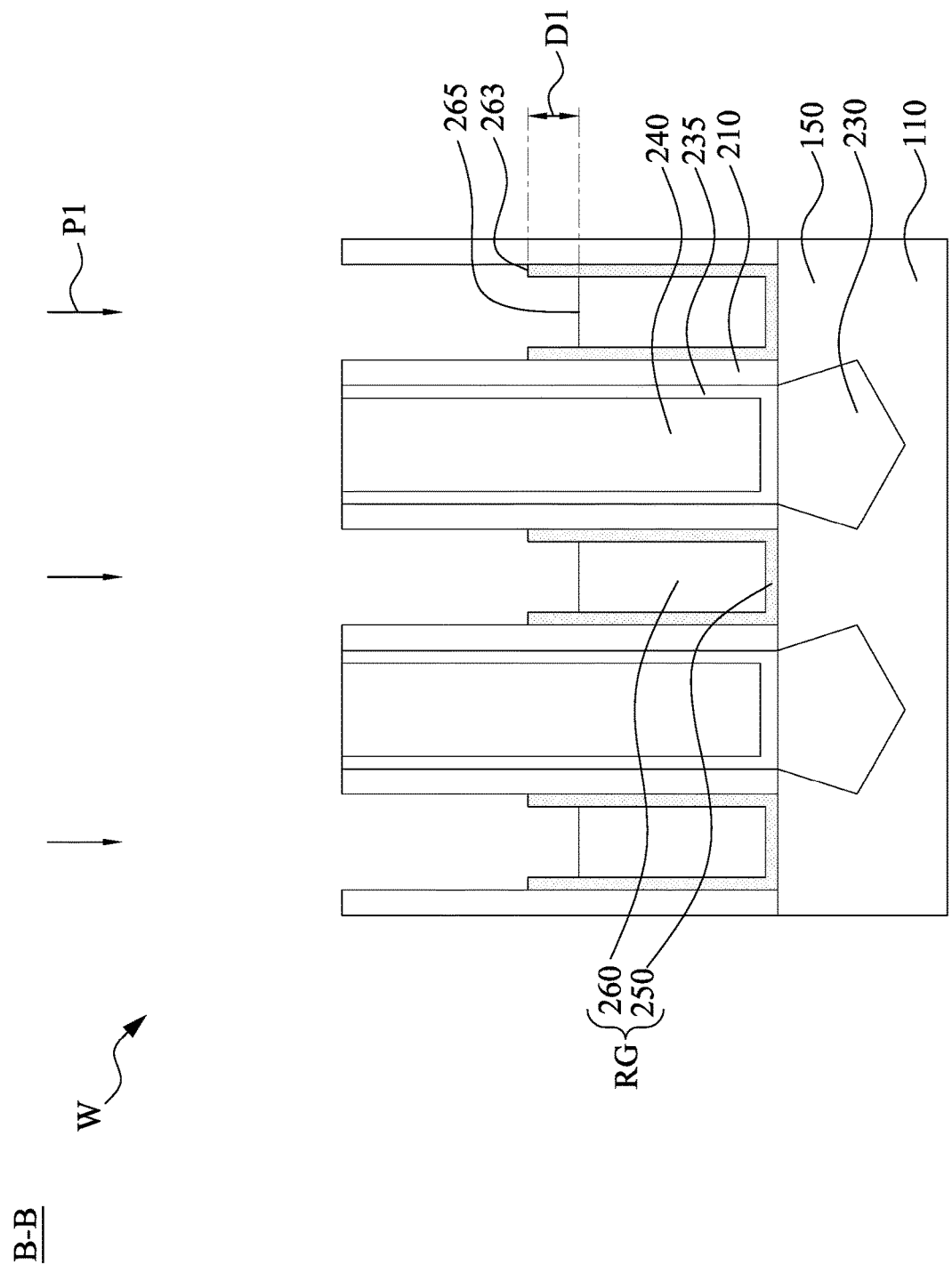

As shown in FIGS. 16A and 16B, a first etching step P1 is performed on the gate dielectric layer 250 and the work function metal 260. In some embodiments, the first etching step P1 is a wet etching process, a dry etching process, or combinations thereof. In some embodiments, the first etching step P1 is a plasma etching process. For the sake of clarity, the plasma etching process described herein is referred to as a first plasma etching process.

In some embodiments, the first plasma etching step P1 using a first reactant gas (e.g., a chlorine-containing gas, such as $BCl_3$) is performed to thin down the gate structures RG. In some embodiments, the first plasma etching step P1 uses a gas mixture of $Cl_2$, $O_2$, $BCl_3$, and Ar with a bias in a range from about 25V to about 1200V. In some embodiments, the first plasma etching step P1 uses a gas mixture of $Cl_2$, $O_2$, $BCl_3$, and Ar without a bias.

In some embodiments where $HfO_2$ is used as the gate dielectrics. For example, Hf—O bond breaking is the first step followed by Cl adsorption by Hf atoms that produces solid $HfCl_x$ and $BCl_x$ adsorption by bond cleaved O that generated solid $B_mOCl_n$. Later $HfCl_x$ and $B_mOCl_n$ solids are etched as volatile $HfCl_x$ (x=2-4), BOCl, $B_2OCl_3$ and $B_2OCl_4$ by ion impact reactions.

In some embodiments where TiN is used as work function metals, an example etching mechanism of TiN in $Ar/BCl_3/Cl_2$ plasmas is described as follows. For example, TiN etching begins with ion bombardment to break Ti—N bonds and liberate N atoms. The Ti site then absorbs Cl leading to formation of $TiCl_n$ (n=1-3) on a surface of the TiN layer. Ion bombardment removes these compounds as $TiCl_n$ gas. TiN surface can itself absorb Cl to produce TiNCl on the surface of TiN layer, followed by energetic ion bombardment containing Cl to remove Ti from TiNCl as volatile $TiCl_n$ gas.

During the first etching step P1, a removal rate (i.e., etch rate) of the work function metal 260 is greater than a removal rate of the gate dielectric layer 250. Therefore, after the first plasma etching step P1 is performed, a top surface 265 of the work function metal 260 is lower than a top surface 263 of the gate dielectric layer 250. In some embodiments, a distance D1 between a top surface 265 of the work function metal 260 and a top surface 263 of the gate dielectric layer 250 is greater than about 4 nm. For example, the distance D1 between the work function metal 260 and the gate dielectric layer 250 may be about 5 nm, 6 nm, 7 nm, 8 nm, 9 nm, or 10 nm. In some embodiments, the first reactant is free from bromine-containing gases which may reduce the efficiency of removing work function metal.

Reference is made to FIGS. 17A-18B. A second etching step P2 is performed on the gate dielectric layer 250 and the work function metal 260. In some embodiments, the second etching step P2 is a plasma etching process. For the sake of clarity, the plasma etching process described herein is referred to as a second plasma etching process.

In some embodiments, the second plasma etching process P2 using a second reactant gas (e.g., a bromine-containing gas, such as HBr) is performed to thin down the gate dielectric layer 250 and simultaneously to form a protection layer 266 over the work function metal 260 to protect the work function metal 260 during the second plasma etching step P2. In some embodiments, the second plasma etching step P2 may use a gas mixture of Ar and HBr with a bias in a range from about 25V to about 1200V. In some embodiments, the second plasma etching step P2 may use a gas mixture of Ar and HBr without a bias.

Figure 17A:
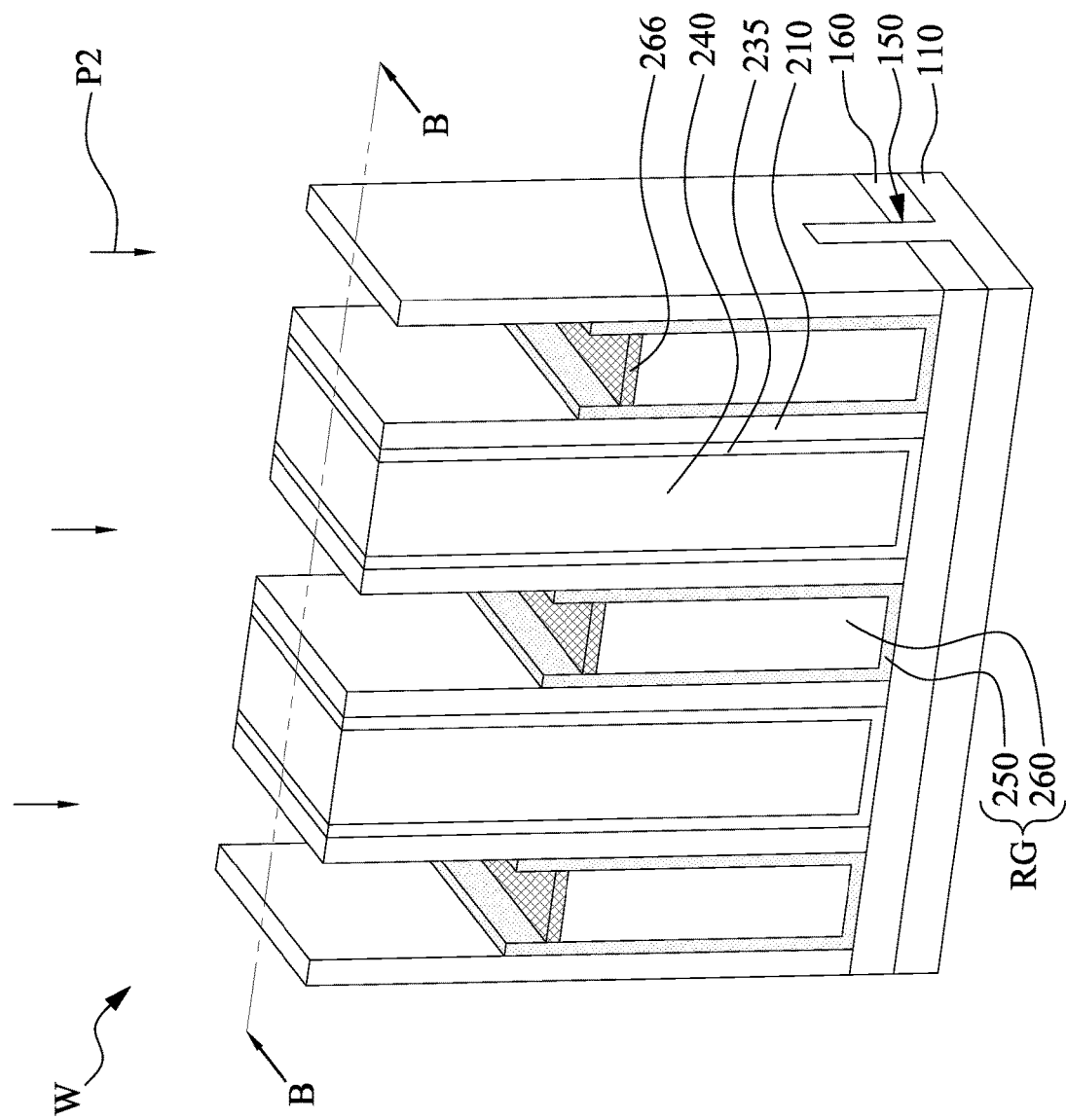
Figure 17B:
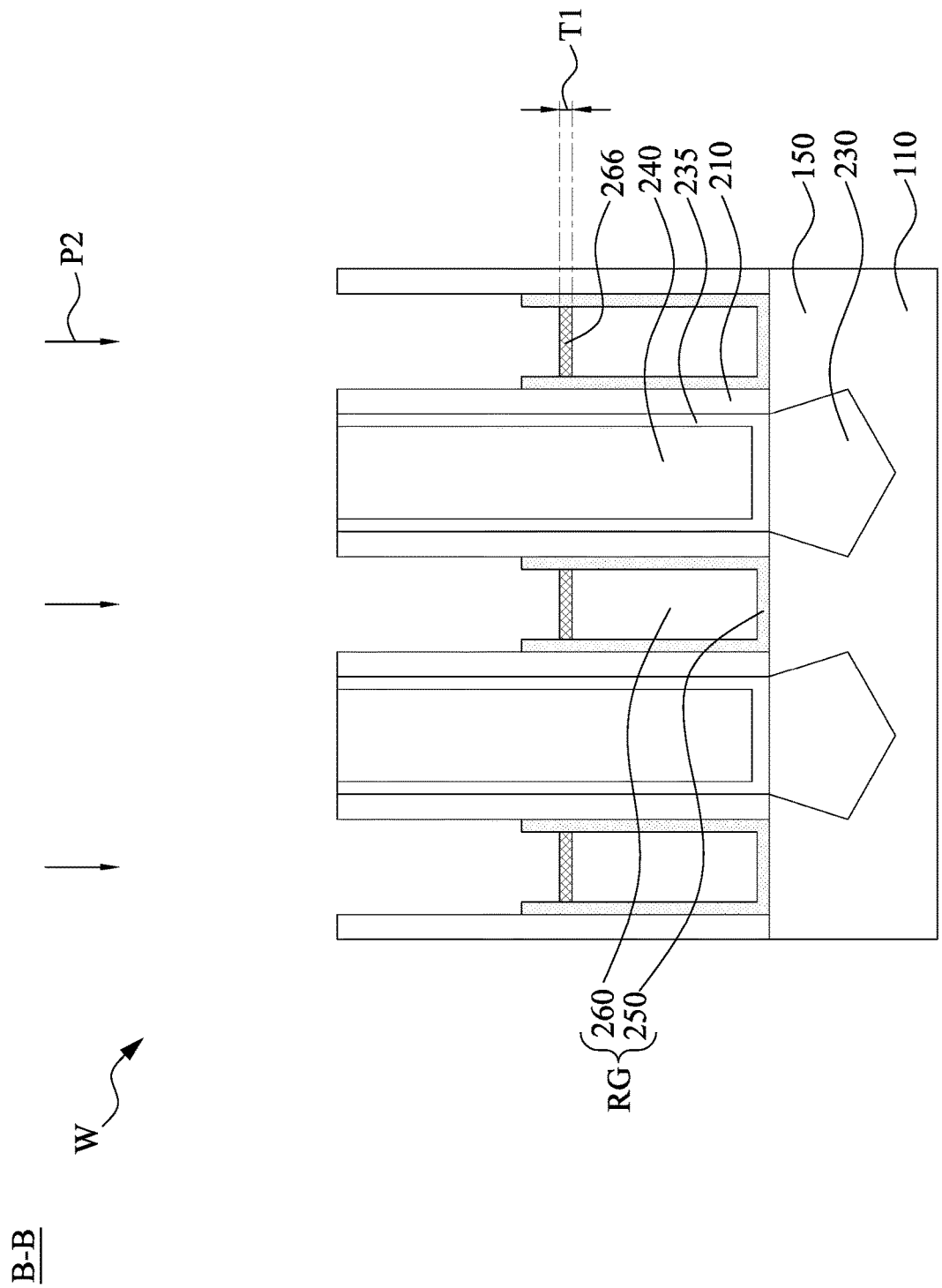

As shown in FIGS. 17A and 17B, the second plasma etching process P2 is performed by using the bromine-containing gas such that a protection layer 266 is formed on the work function metal 260 to protect the work function metal 260 during the second plasma etching process P2.

For example, the bromide anion (Br⁻) of the bromine-containing gas may tend to react with the work function metal 260 to form the protection layer 266. In greater detail, in some embodiments where TiN is used as work function metals, an ion bombardment to break Ti—N bonds and liberate N atoms. The Ti site then absorbs Br leading to formation of $TiBr_n$ (n=1-3) on a surface of the TiN layer. That is, the bromine-containing gas is introduced on the work function metal 260 to replace nitrogen atoms in the work function metal 260, so as to form the protection layer (i.e., metal bromide layer in this case) 266 over the surface of the work function metal 260. In some embodiments, the bromine-containing gas may be in a plasma state.

In some embodiments, the protection layer 266 may include bromine-containing polymers, e.g., titanium bromide ($TiBr_x$), tantalum bromide ($TaBr_x$), tungsten bromide ($WBr_x$), aluminum bromide ($AlBr_x$), zirconium bromide ($ZrBr_x$) or hafnium bromide ($HfBr_x$), where x=1-5. In some embodiments, the protection layer 266 and the work function metal 260 may include substantially the same element(s). That is, in some embodiments, the work function metal 260 may include Ti, Ta, W, Al, Zr or Hf.

In some embodiments, the protection layer 266 may remain on the work function metal 260, and thus can be used to avoid the work function metal 260 from being further etched during the second plasma etching process P2. That is, in some embodiments, the thickness of the work function metal 260 may be kept rather than further lowered during the second plasma etching process P2. In some embodiments, a thickness T1 of the protection layer 266 is less than about 1 nm. For example, the thickness T1 of the protection layer 266 may be about 1 nm, 0.9 nm, 0.8 nm, 0.7 nm, 0.6 nm, 0.5 nm, 0.4 nm, 0.3 nm, 0.2 nm, or 0.1 nm.

Figure 25:
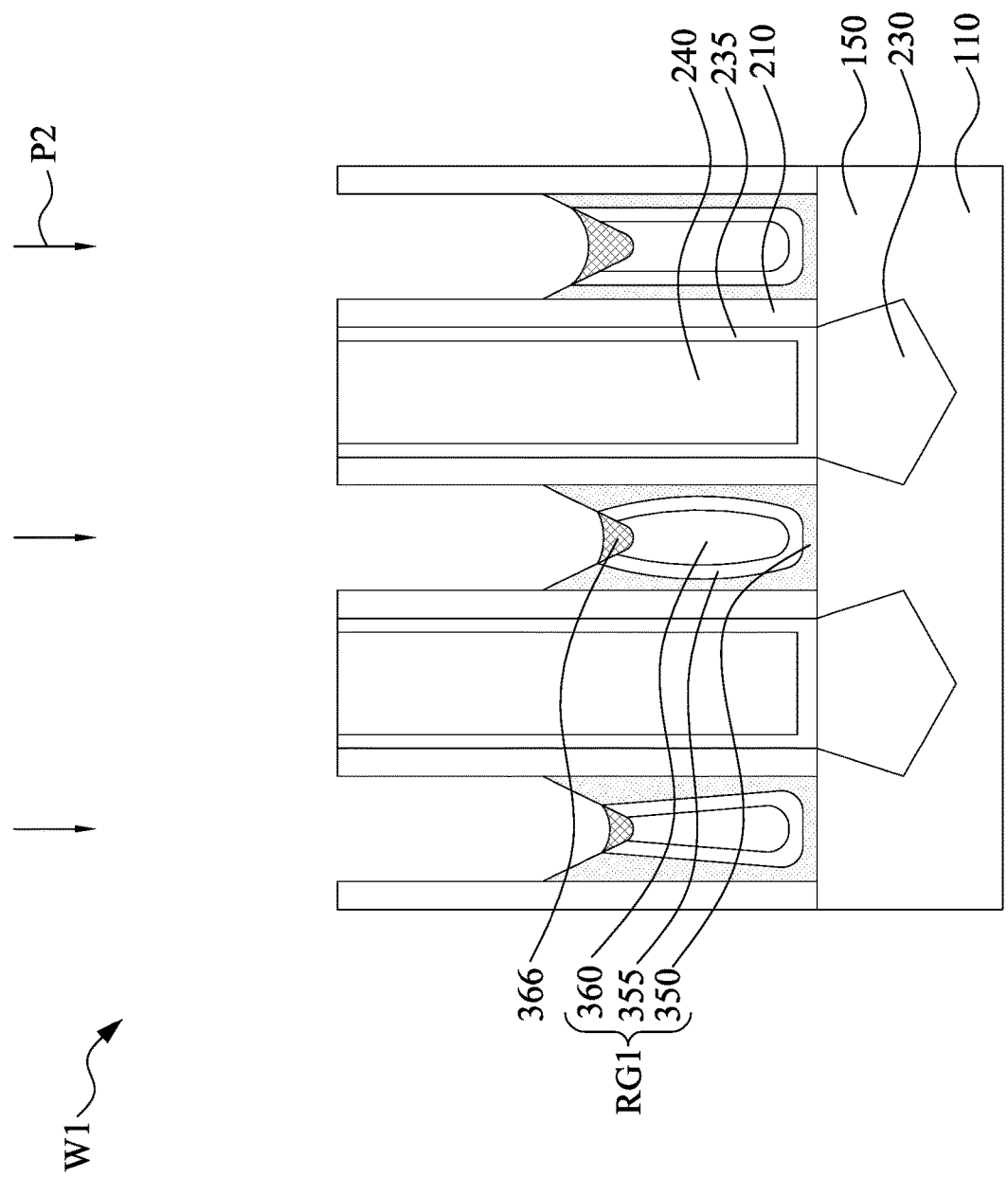
FIG. 25 illustrates a wafer at a stage corresponding to FIG. 17B according to some embodiments of the present disclosure.

FIG. 25 illustrates another wafer W1 at a stage corresponding to FIG. 17B according to some alternative embodiments of the present disclosure to illustrate different profiles of gate structures at the beginning of the second plasma etching process P2.

As shown in FIG. 25, the second plasma etching process P2 is performed by using the bromine-containing gas such that the protection layer 266 is formed on the first and second work function metals 355 and 360 to protect the first and second work function metals 355 and 360 during the second plasma etching process P2.

For example, the bromide anion (Br⁻) of the bromine-containing gas may tend to react with the first and second work function metals 355 and 360 to form the protection layer 366. In greater detail, in some embodiments where TiN is used as one of the work function metals, an ion bombardment to break Ti—N bonds and liberate N atoms. The Ti site then absorbs Br leading to formation of $TiBr_n$ (n=1-3) on a surface of the TiN layer. That is, the bromine-containing gas is introduced on the first work function metals 355 or the second work function metal 360 to replace nitrogen atoms in the first work function metal 355 or the second work function metal 360, so as to form the protection layer (i.e., metal bromide layer in this case) 366 over the surface of the first and second work function metalss 355 and 360. In some embodiments, the bromine-containing gas may be in a plasma state.

In some embodiments, the protection layer 366 may include bromine-containing polymers, e.g., titanium bromide ($TiBr_x$), tantalum bromide ($TaBr_x$), tungsten bromide ($WBr_x$), aluminum bromide ($AlBr_x$), zirconium bromide ($ZrBr_x$) or hafnium bromide ($HfBr_x$), where x=1-5. In some embodiments, the protection layer 366 and the work function metal 360 may include substantially the same element(s). That is, in some embodiments, the work function metal 360 may include Ti, Ta, W, Al, Zr or Hf.

In some embodiments, the protection layer 366 may remain on the work function metal 360, and thus can be used to avoid the work function metal 360 from being further etched during the second plasma etching process P2. That is, in some embodiments, the thickness of the work function metal 360 may be kept rather than further lowered during the second plasma etching process P2. In some embodiments, a thickness of the protection layer 366 is less than about 1 nm. For example, the thickness of the protection layer 366 may be about 1 nm, 0.9 nm, 0.8 nm, 0.7 nm, 0.6 nm, 0.5 nm, 0.4 nm, 0.3 nm, 0.2 nm, or 0.1 nm.

In some embodiments, the gate dielectric layer 350 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 350 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 350 may have a multilayer structure such as one layer of silicon oxide (e.g., interfacial layer) and another layer of high-k material. In some embodiments, the gate dielectric layer 350 is made of the same material because they are formed from the same dielectric layer blanket deposited over the substrate 110.

In some embodiments, a material of the first work function metal 355 is different from a material of the second work function metal 360. In some embodiments, the first work function metal 355 may act as an adhesive layer. In some embodiments, the first work function metal 355 may act as a barrier layer. In some embodiments, the first work function metal 355 or the second work function metal 360 may include suitable work function metals to provide suitable work functions. In some embodiments, the first work function metal 355 or the second work function metal 360 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the first work function metal 355 or the second work function metal 360 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals 355 are made of different work function metals so as to achieve suitable work functions in some embodiments. In some embodiments, an entirety of the work function metal 360 is a work function metal. At least two of the work function metals 360 are made of different work function metals so as to achieve suitable work functions in some embodiments. In some embodiments, an entirety of the work function metal 360 is a work function metal.

Figure 18A:
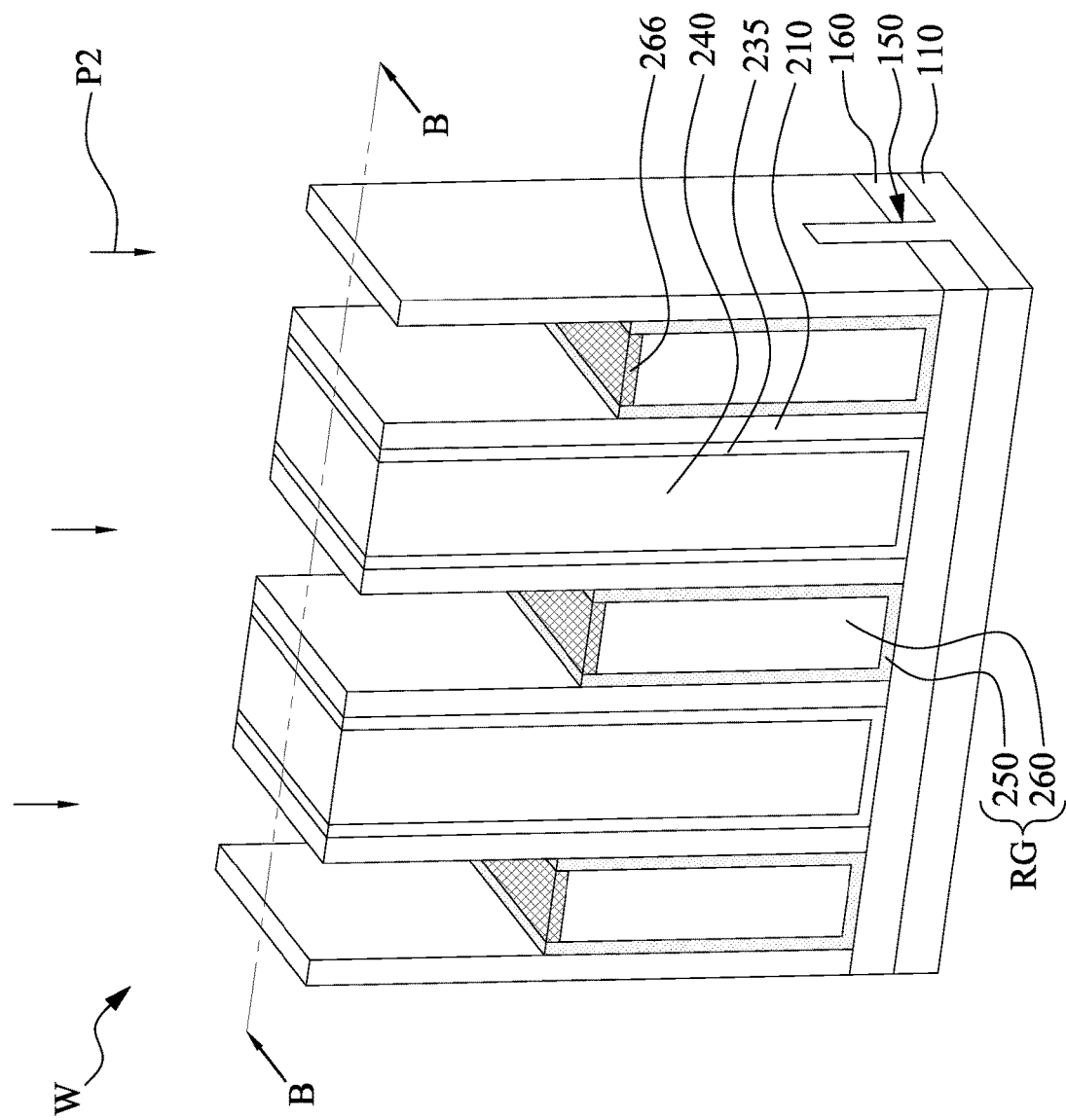
Figure 18B:
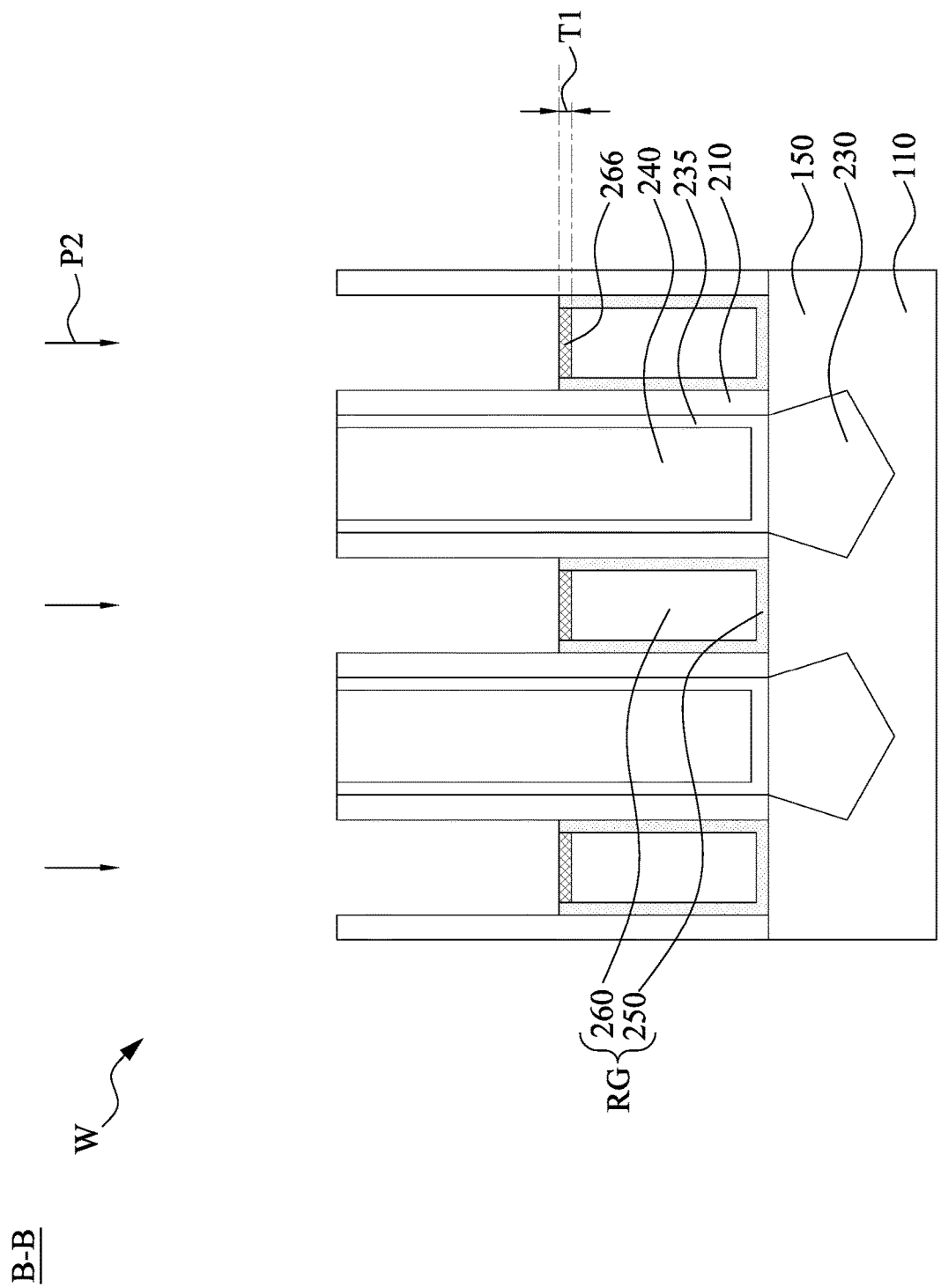

As shown in FIGS. 18A and 18B, the second plasma etching process P2 is performed by using the bromine-containing gas such that a portion of the gate dielectric layer 250 above the protection layer 266 may be removed.

For example, the bromide anion ($Br^-$) of the bromine-containing gas may tend to react with the gate dielectric layer 250. In some embodiments, where $HfO_2$ is used as the gate dielectrics, an example etching mechanism of the $HfO_2$ in Ar/HBr plasmas is described as follows. For example, Hf—O bond breaking is the first step followed by Br adsorption by Hf atoms that produces solid $HfBr_x$. Later $HfBr_x$ solids are etched as volatile $HfBr_x$ (x=2-4) by ion impact reactions. In some embodiments, after the forming of the protection layer 266, the second plasma etching process P2 has a first removal rate of the metal bromine layer 266 and a second removal rate of the gate dielectric layer 250, and a first ratio of the first removal rate of the metal bromine layer 266 to the second removal rate of the gate dielectric layer 250 is greater than about 5. In some embodiments, the first plasma etching process P1 has a first removal rate of the gate dielectric layer 250, the second plasma etching process P2 has a second removal rate of the gate dielectric layer 250, and the first removal rate is greater than the second removal rate.

In some embodiments, after performing of the second plasma etching process P2, a top surface of the protection layer 266 is substantially coplanar with a top surface of the gate dielectric layer 250. Accordingly, the present disclosure provides a method for decreasing the height difference between the work function metal 260 and the gate dielectric layer 250. In some embodiments, after the performing of the second etching step P2, a top surface of the work function metal 260 is lower than a top surface of the gate dielectric layer 250, and a distance between the top surface of the work function metal 260 and the top surface of the gate dielectric layer 250 is less than about 1 nm. In some embodiments, after the performing of the second etching step P2, the height difference between the work function metal 260 and the gate dielectric layer 250 is less than about 4 nm, 3 nm, or 2 nm.

Figure 24:
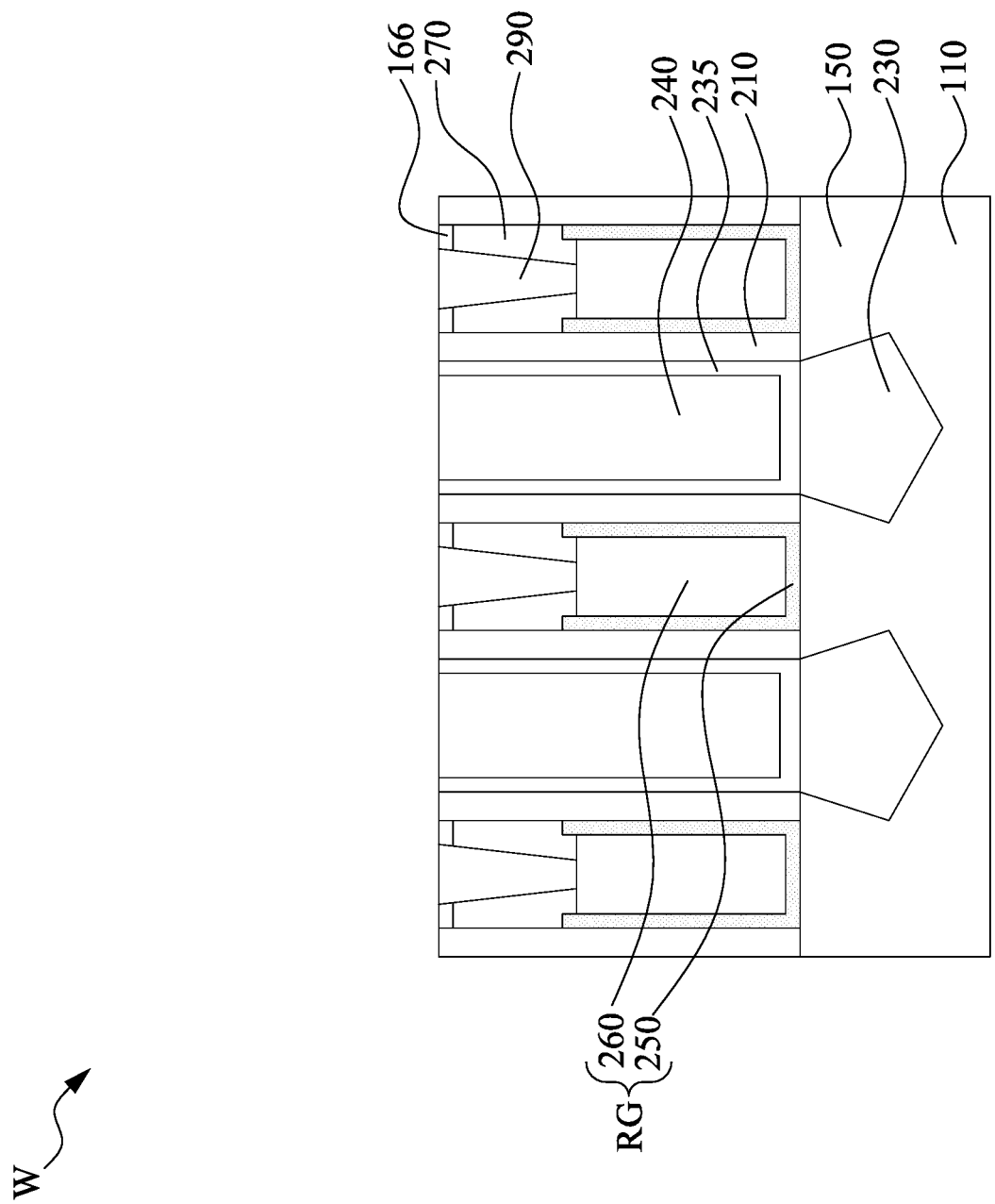

As such, when the gate contact 290 as shown in FIG. 24 lands on the top surface of the work function metal 260, it may reduce the chance that the gate contact 290 may be in contact with the gate dielectric layer 250 which in turn adversely affects the performance of the semiconductor device. In greater detail, the present disclosure uses the second plasma etching step P2 including a bromine-containing gas to thin down the gate dielectric layer 250 and simultaneously to form the protection layer 266 over the work function metal 260 to protect the work function metal 260 during the second plasma etching step P2. After the performing of the second plasma etching step P2, a top surface of the protection layer 266 may be substantially coplanar with a top surface of the gate dielectric layer 250. As such, the distance between top surfaces of the work function metal 260 and the gate dielectric layer 250 may be controlled by the thickness of the protection layer 266, such as less than about 1 nm.

In some embodiments, the second plasma etching step P2 may use a third reactant gas (e.g., a chlorine-containing gas, such as $BCl_3$) simultaneously with the second reactant gas to thin down the gate dielectric layer 250 of the gate structures RG. In some embodiments, the third reactant gas may be different from the second reactant gas. In some embodiments, the third reactant gas may be a gas mixture of $Cl_2$, $O_2$, $BCl_3$, and Ar.

In some embodiments where $HfO_2$ is used as the gate dielectrics. For example, Hf—O bond breaking is the first step followed by Cl adsorption by Hf atoms that produces solid $HfCl_x$ and $BCl_x$ adsorption by bond cleaved O that generated solid $B_mOCl_n$. Later $HfCl_x$ and $B_mOCl_n$ solids are etched as volatile $HfCl_x$ (x=2-4), BOCl, $B_2OCl_3$ and $B_2OCl_4$ by ion impact reactions. In some embodiments, an amount of the bromine-containing gas is greater than an amount of the chorine-containing gas. For example, the amount of the bromine-containing gas is in a range from about 120 to about 180 sccm, and the amount of the chlorine-containing gas is in a range from about 80 to about 120 sccm. In some embodiment, a ratio of the amount of the bromine-containing gas to the amount of the chlorine-containing gas is in a range from about 1.2:1 to about 1.8:1.

During the first etching step P2, the protection layer 266 that forms on the work function metal 260 may prevent the work function metal 260 from being etched by the third reactant gas. That is, in some embodiments, the thickness of the work function metal 260 may be kept rather than further lowered during the second plasma etching process P2.

In some embodiments, the $HfCl_x$ and $B_mOCl_n$ solids associated with the third reactant gas has a first boiling point, the $HfBr_x$ solid associated with the second reactant gas has a second boiling point, and the second boiling point is lower than the first boiling point. In some embodiments, the second boiling point of the $HfBr_x$ is in a range of from about 350° C. to about 450° C. under a pressure of 1 atm. In some embodiments, the fjirst boiling point of the $HfCl_x$ or $B_mOCl_n$ is in a range of from 600° C. to 800° C. under a pressure of 1 atm.

The boiling points mentioned above result in the removal rate of the gate dielectric layer 250. In greater detail, in some embodiments, the second reactant of the second plasma etching process P2 has a first removal rate of the gate dielectric layer 250, the third reactant of the second plasma etching process P2 has a second removal rate of the gate dielectric layer 250, and the first removal rate is greater than the second removal rate due to the lower boiling point of the $HfBr_x$ solid. That is, the second reactant dominates the etching rate of the gate dielectric layer 250 in the second plasma etching process P2.

Figure 26:
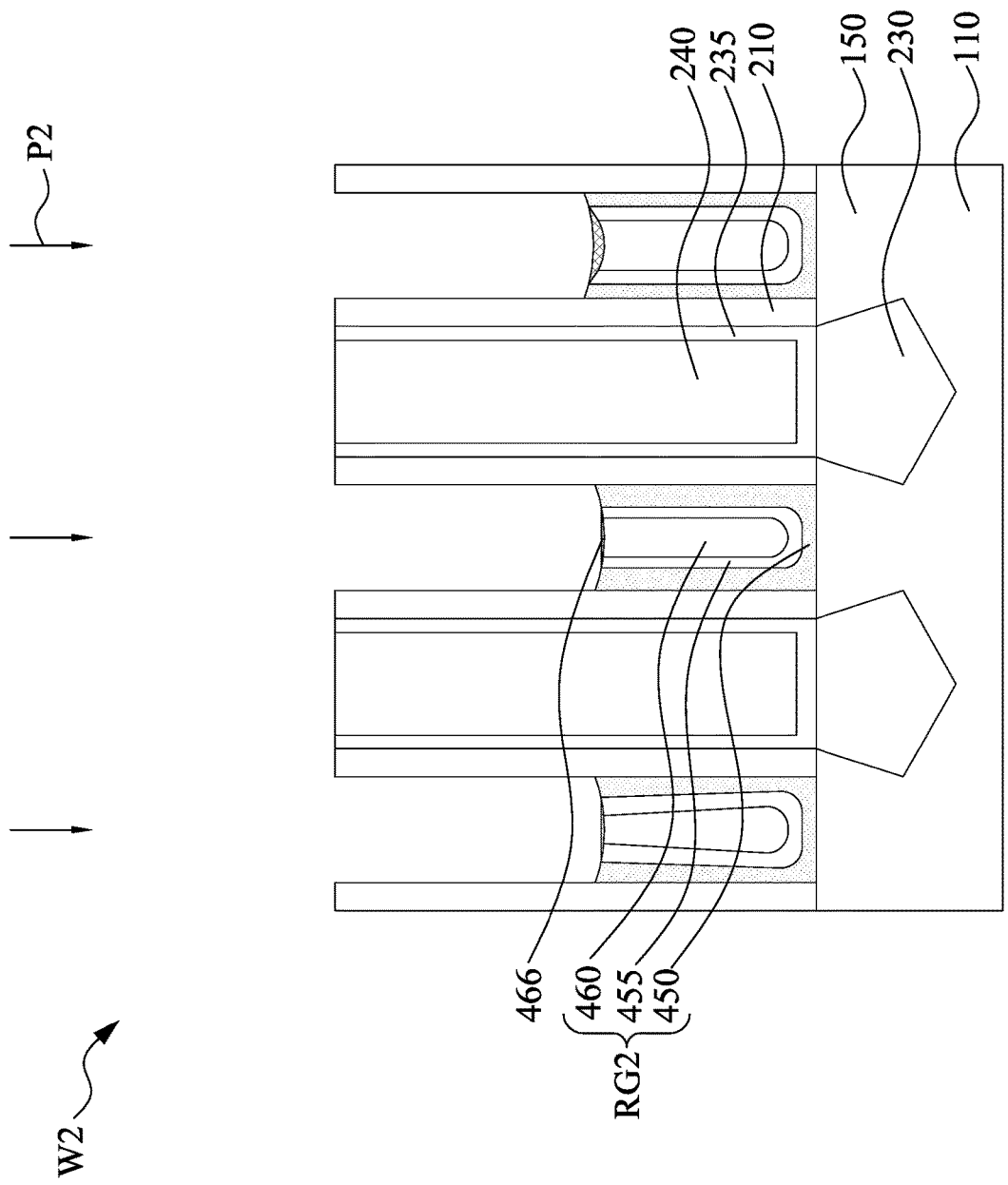
FIG. 26 illustrates a wafer at a stage corresponding to FIG. 18B according to some embodiments of the present disclosure.

FIG. 26 illustrates another wafer W2 at a stage corresponding to FIG. 18B according to some alternative embodiments of the present disclosure to illustrate different profiles of gate structures resulting from the second plasma etching process P2.

As shown in FIG. 26, the second plasma etching process P2 is performed by using the bromine-containing gas such that a portion of the gate dielectric layer 450 above the protection layer 466 may be removed.

For example, the bromide anion ($Br^-$) of the bromine-containing gas may tend to react with the gate dielectric layer 450. In some embodiments, where $HfO_2$ is used as the gate dielectrics, an example etching mechanism of the $HfO_2$ in Ar/HBr plasmas is described as follows. For example, Hf—O bond breaking is the first step followed by Br adsorption by Hf atoms that produces solid $HfBr_x$. Later $HfBr_x$ solids are etched as volatile $HfBr_x$ (x=2-4) by ion impact reactions. In some embodiments, after the forming of the protection layer 466, the second plasma etching process P2 has a first removal rate of the metal bromine layer 466 and a second removal rate of the gate dielectric layer 450, and a first ratio of the first removal rate of the metal bromine layer 466 to the second removal rate of the gate dielectric layer 450 is greater than about 5. In some embodiments, the first plasma etching process P1 has a first removal rate of the gate dielectric layer 450, the second plasma etching process P2 has a second removal rate of the gate dielectric layer 450, and the first removal rate is greater than the second removal rate.

In some embodiments, after performing of the second plasma etching process P2, a top surface of the protection layer 466 is substantially coplanar with a top surface of the gate dielectric layer 450. Accordingly, the present disclosure provides a method for decreasing the height difference between the first and second work function metals 455 and 460 and the gate dielectric layer 450. In some embodiments, after the performing of the second etching step P2, top surfaces of the first and second work function metals 455 and 460 is lower than a top surface of the gate dielectric layer 450, and/or a distance between the top surface of the first work function metal 455 and the top surface of the gate dielectric layer 450 is less than about 1 nm, and/or a distance between the top surface of the second work function metal 460 and the top surface of the gate dielectric layer 450 is less than about 1 nm. In some embodiments, after the performing of the second etching step P2, the height difference between the first second work function metal 455 and the gate dielectric layer 450 is less than about 4 nm, 3 nm, or 2 nm. In some embodiments, after the performing of the second etching step P2, the height difference between the second work function metal 460 and the gate dielectric layer 450 is less than about 4 nm, 3 nm, or 2 nm.

In some embodiments, the second plasma etching step P2 may use a third reactant gas (e.g., a chlorine-containing gas, such as $BCl_3$) simultaneously with the second reactant gas to thin down the gate dielectric layer 450 of the gate structures RG2. In some embodiments, the third reactant gas may be different from the second reactant gas. In some embodiments, the third reactant gas may be a gas mixture of $Cl_2$, $O_2$, $BCl_3$, and Ar.

In some embodiments where $HfO_2$ is used as the gate dielectrics. For example, Hf—O bond breaking is the first step followed by Cl adsorption by Hf atoms that produces solid $HfCl_x$ and $BCl_x$ adsorption by bond cleaved O that generated solid $B_mOCl_n$. Later $HfCl_x$ and $B_mOCl_n$ solids are etched as volatile $HfCl_x$ (x=2-4), BOCl, $B_2OCl_3$ and $B_2OCl_4$ by ion impact reactions. In some embodiments, an amount of the bromine-containing gas is greater than an amount of the chorine-containing gas. For example, the amount of the bromine-containing gas is in a range from about 120 to about 180 sccm, and the amount of the chlorine-containing gas is in a range from about 80 to about 120 sccm. In some embodiment, a ratio of the amount of the bromine-containing gas to the amount of the chlorine-containing gas is in a range from about 1.2:1 to about 1.8:1.

During the first etching step P2, the protection layer 466 that forms on the work function metal 460 may prevent the work function metal 460 from being etched by the third reactant gas. That is, in some embodiments, the thickness of the first and second work function metals 455 and 460 may be kept rather than further lowered during the second plasma etching process P2.

In some embodiments, the $HfCl_x$ and $B_mOCl_n$ solids associated with the third reactant gas has a first boiling point, the $HfBr_x$ solid associated with the second reactant gas has a second boiling point, and the second boiling point is lower than the first boiling point. In some embodiments, the second boiling point of the $HfBr_x$ is in a range of from about 350° C. to about 450° C. under a pressure of 1 atm. In some embodiments, the fjirst boiling point of the $HfCl_x$ or $B_mOCl_n$ is in a range of from 600° C. to 800° C. under a pressure of 1 atm.

The boiling points mentioned above result in the removal rate of the gate dielectric layer 450. In greater detail, in some embodiments, the second reactant of the second plasma etching process P2 has a first removal rate of the gate dielectric layer 450, the third reactant of the second plasma etching process P2 has a second removal rate of the gate dielectric layer 450, and the first removal rate is greater than the second removal rate due to the lower boiling point of the $HfBr_x$ solid. That is, the second reactant dominates the etching rate of the gate dielectric layer 450 in the second plasma etching process P2.

In some embodiments, the protection layer 466 may include bromine-containing polymers, e.g., titanium bromide (TiBr$_x$), tantalum bromide (TaBr$_x$), tungsten bromide (WBr$_x$), aluminum bromide (AlBr$_x$), zirconium bromide (ZrBr$_x$) or hafnium bromide (HfBr$_x$), where x=1-5. In some embodiments, the protection layer 466 and the first and second work function metals 455 and 460 may include substantially the same element(s). That is, in some embodiments, the first and second work function metals 455 and 460 may include Ti, Ta, W, Al, Zr or Hf.

In some embodiments, the gate dielectric layer 450 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 450 may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide (Ta$_2$O$_5$), yttrium oxide (Y$_2$O$_3$), strontium titanium oxide (SrTiO$_3$, STO), barium titanium oxide (BaTiO$_3$, BTO), barium zirconium oxide (BaZrO), hafnium lanthanum oxide (HfLaO), lanthanum silicon oxide (LaSiO), aluminum silicon oxide (AlSiO), aluminum oxide (Al$_2$O$_3$), silicon nitride (Si$_3$N$_4$), oxynitrides (SiON), and combinations thereof. In alternative embodiments, the gate dielectric layer 450 may have a multilayer structure such as one layer of silicon oxide (e.g., interfacial layer) and another layer of high-k material. In some embodiments, the gate dielectric layer 450 is made of the same material because they are formed from the same dielectric layer blanket deposited over the substrate 110.

In some embodiments, a material of the first work function metal 455 is different from a material of the second work function metal 460. In some embodiments, the first work function metal 455 may act as an adhesive layer. In some embodiments, the first work function metal 455 may act as a barrier layer. In some embodiments, the first work function metal 455 or the second work function metal 460 may include suitable work function metals to provide suitable work functions. In some embodiments, the first work function metal 455 or the second work function metal 460 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the first work function metal 455 or the second work function metal 460 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals 455 are made of different work function metals so as to achieve suitable work functions in some embodiments. In some embodiments, an entirety of the work function metal 460 is a work function metal. At least two of the work function metals 460 are made of different work function metals so as to achieve suitable work functions in some embodiments. In some embodiments, an entirety of the work function metal 460 is a work function metal.

Figure 19A:
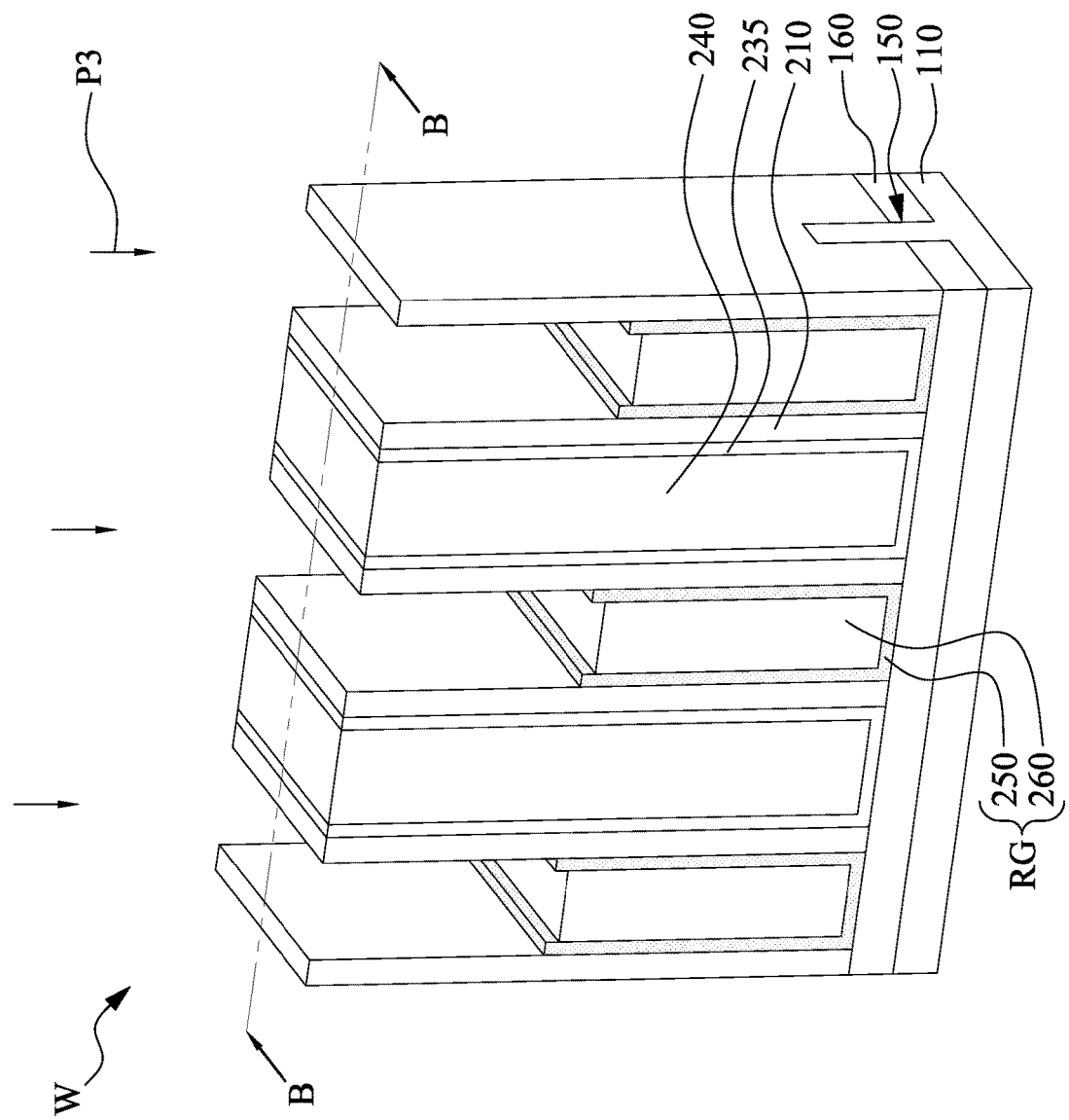
Figure 19B:
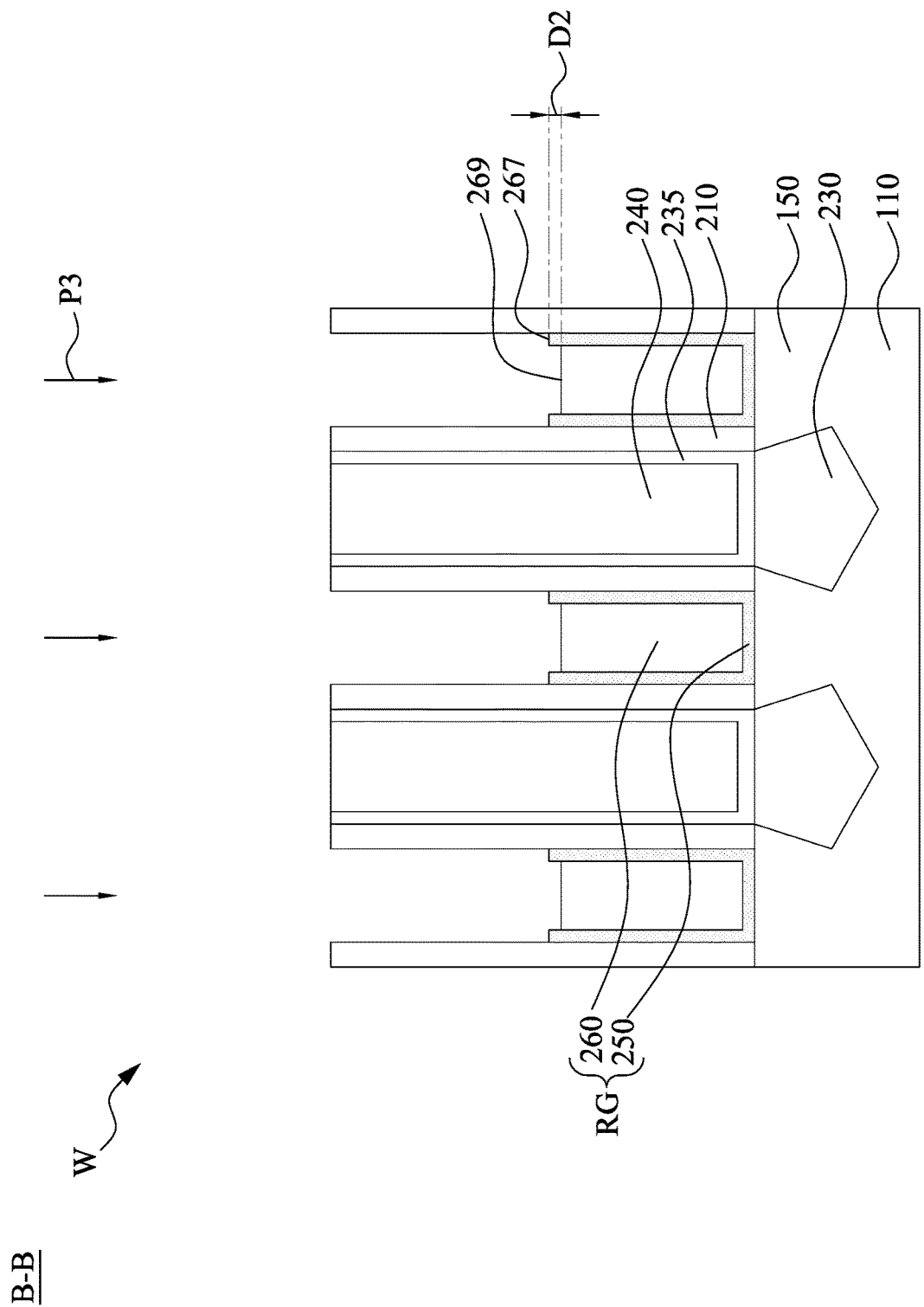

Reference is made to FIGS. 19A and 19B. The protection layer 266 is removed. In some embodiments, an ashing process P3 is performed to remove the protection layer 266 from the surface of the work function metal 260. The protection layer 266 may be removed by for example, ashing in an oxygen (O$_2$) plasma and wet-etch solution including H$_2$SO$_4$/H$_2$O$_2$. In some embodiments, the ashing step P3 may be performed at a temperature that is in a range from about 150° C. to about 250° C. For example, the ashing process P3 may be performed at 150° C., 160° C., 170° C., 180° C., 190° C., or 200° C. In some embodiments, if the ashing step P3 performs at a temperature greater than about 250° C., then in turn adversely affects the performance of the semiconductor device. In some embodiments, if the ashing step P3 performs at a temperature less than about 150° C., then residue of the protection layer 266 may remain on the gate electrode 260.

In some embodiments, a distance D2 between a top surface 267 of the gate dielectric layer 250 and a top surface 269 of the work function metal 260 is less than about 1 nm. In some embodiments, the distance D2 between the top surface 267 of the gate dielectric layer 250 and the top surface 269 of the work function metal 260 is less than about 4 nm, 3 nm, or 2 nm.

Figure 20A:
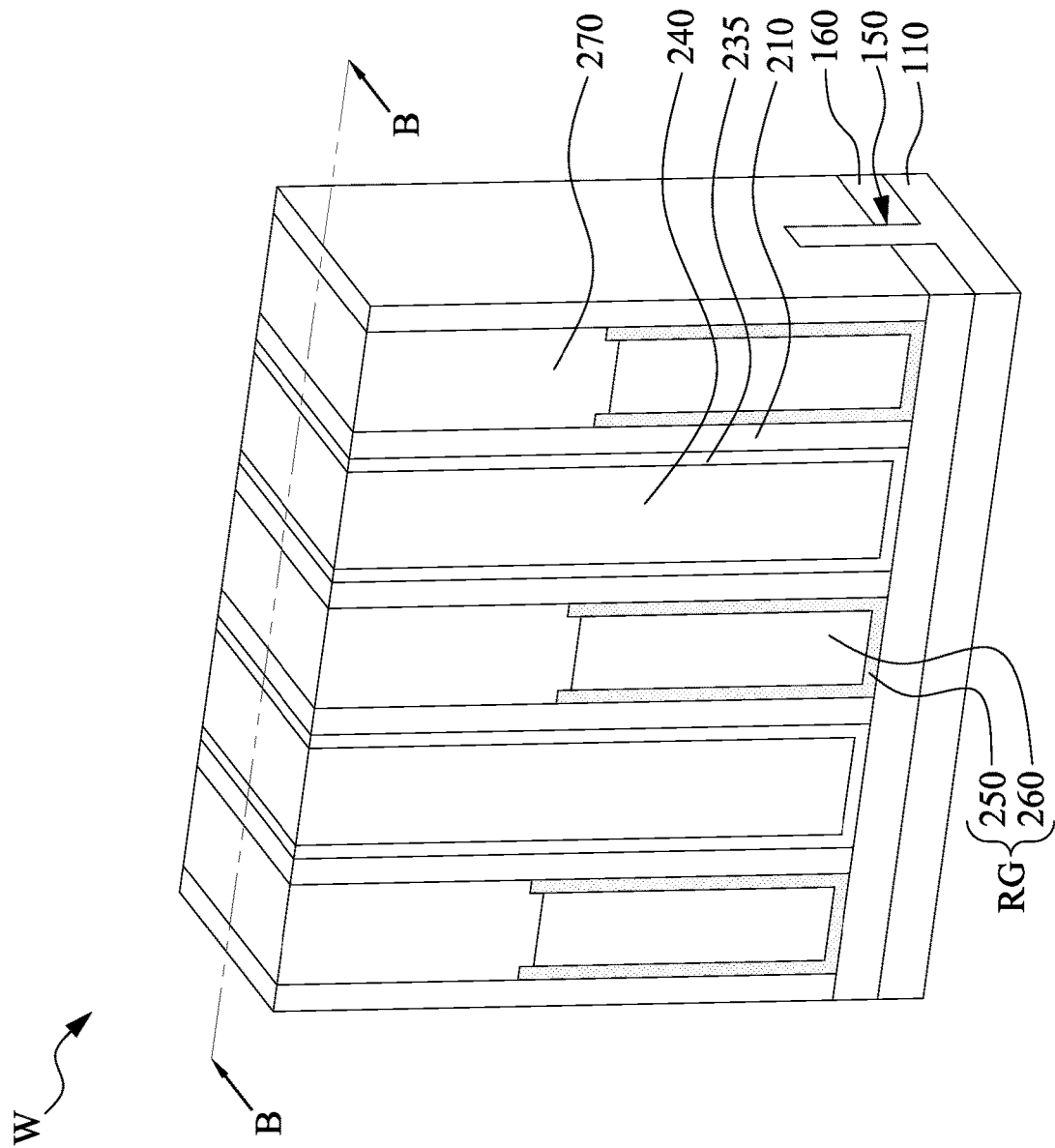
Figure 20B:
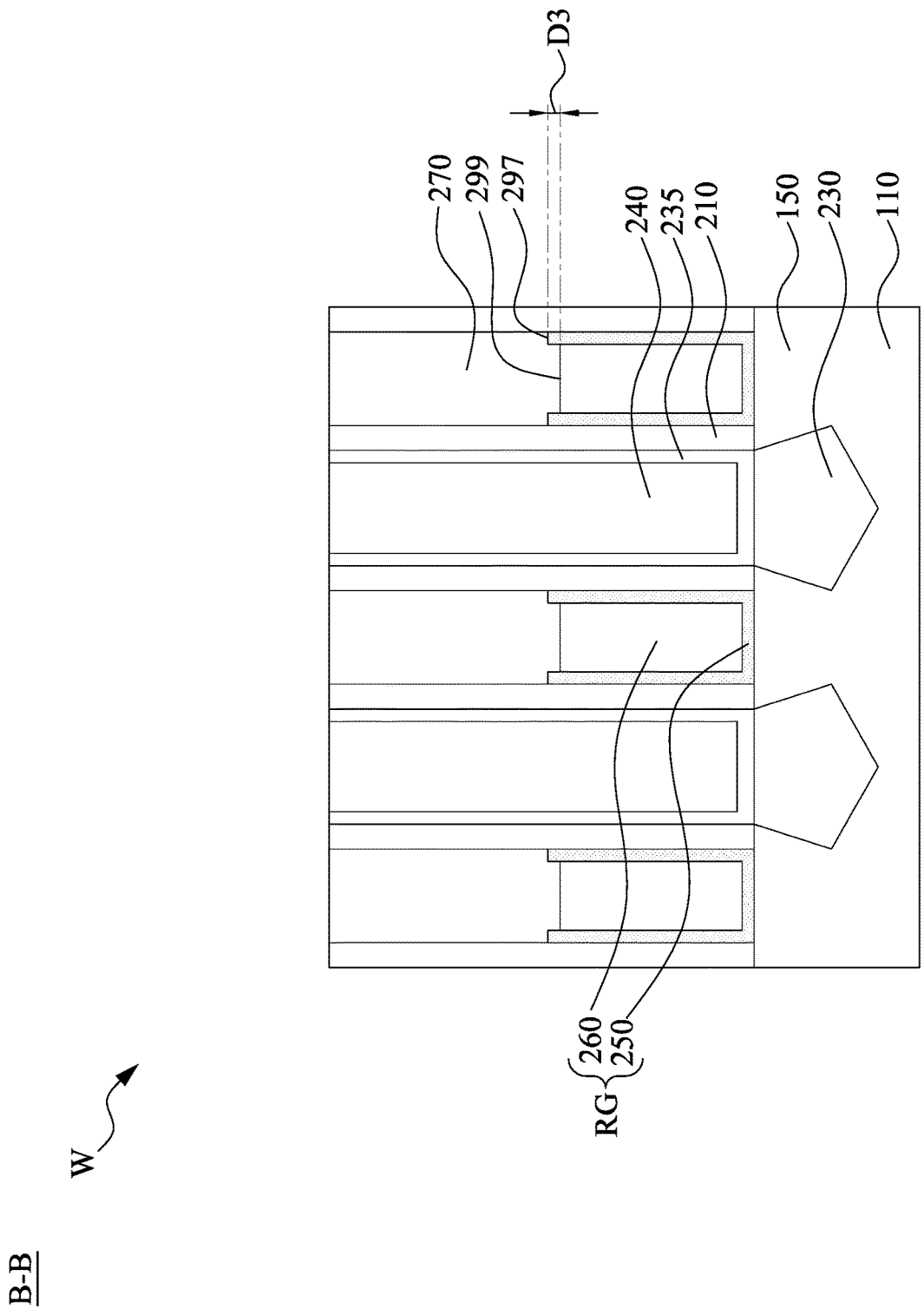

Returning to FIG. 1B, the method M then proceeds to block S25 where dielectric caps are formed over respective gate structures. With reference to FIGS. 20A and 20B, in some embodiments of block S25, dielectric caps 270 are formed over respective gate structures RG using, for example, a deposition process to deposit a dielectric material over the substrate 110, followed by a CMP process to remove excess dielectric material outside the gate trenches. In some embodiments, the dielectric caps 270 include silicon nitride or other suitable dielectric material. The dielectric caps 270 have different etch selectivity than the spacers 210, the contact etch stop layer 235, and/or the inter-layer dielectric layer 240, so as to selective etch back the dielectric caps 270. By way of example, if the dielectric cap 270 is SiN, the spacers 210, the contact etch stop layer 235, and/or the inter-layer dielectric layer 240 are dielectric materials different from SiN. The dielectric caps 270 can be used to define self-aligned contact region and thus referred to as SAC structures or a SAC layer.

In some embodiments, the dielectric cap 270 and the a top surface of the high-k dielectric layer have a first interface 297 therebetween, the dielectric cap 270 and the a top surface of the work function metal 260 have a second interface 299 therebetween, and a distance D3 between the first and second interfaces 297 and 299 is less than about 1 nm. In some embodiments, the distance D3 between the first and second interfaces 297 and 299 is less than about 4 nm, 3 nm, or 2 nm.

Returning to FIG. 1B, block S26 in the method M is directed to an improved etch back process for the SAC layer according to some embodiments of the present disclosure. In the present disclosure, the improved etch back process for the SAC layer is a plasma etching process employing one or more etchants such as a fluorine-containing gas (e.g., CF$_4$/H$_2$, SF$_6$, CH$_2$F$_2$, CHF$_3$, C$_2$F$_6$, and/or NF$_3$/N$_2$) and/or a chlorine-containing gas (e.g., Cl$_2$, CHCl$_3$, CCl$_4$, and/or BCl$_3$). In some embodiments, the improved etch back process for the SAC layer is a plasma etching process employing C$_2$H$_6$.

By way of example, the plasma etching process used in the improved etch back process for the SAC layer uses a gas mixture including an argon (Ar) gas, a trifluoromethane ($CH_3F$) gas, an Helium (He) gas, and the like. In certain embodiments of the present disclosure, the improved SAC layer etch back process is a multi-step plasma etching process involving a non-zero bias etching step and a zero-bias etching step in-situ performed in the same plasma process apparatus, as illustrated in FIG. 28.

Figure 21A:
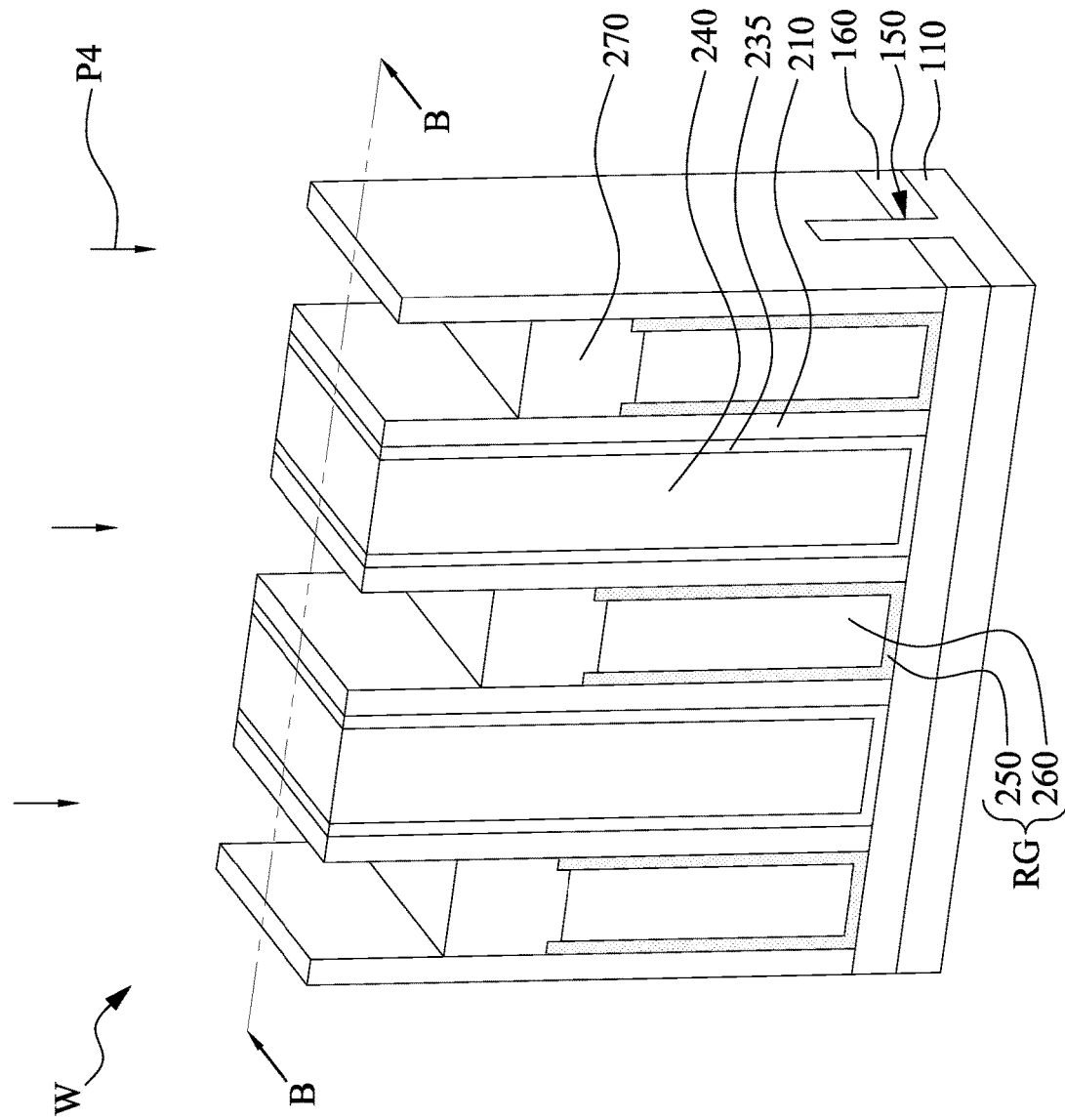
Figure 21B:
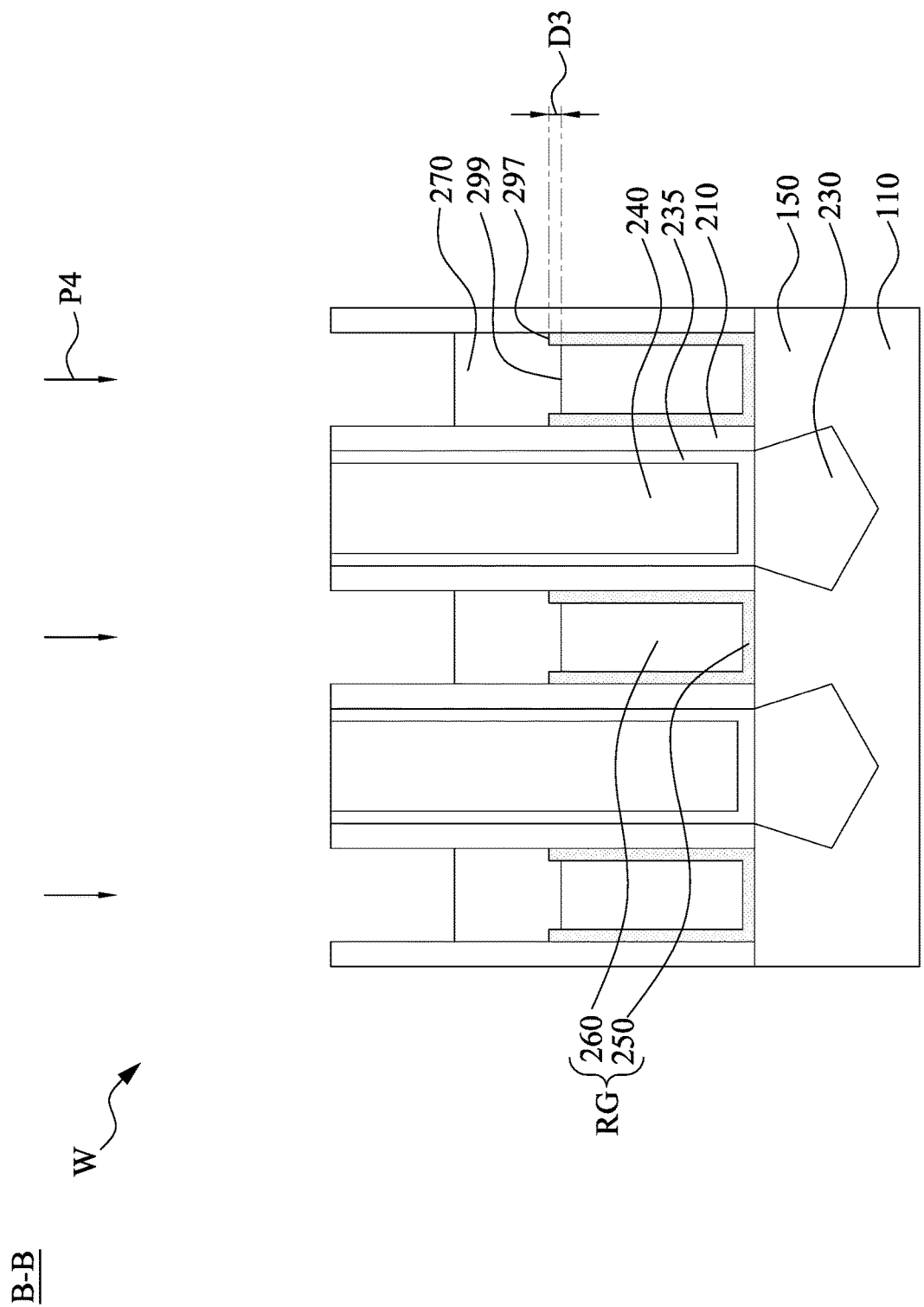

In certain embodiments of block S26, with reference to FIGS. 21A and 21B, the improved SAC layer etch back process is performed. As shown in FIGS. 21A and 21B, the improved SAC layer etch back process P4 is performed on the dielectric caps 270. In some embodiments, the improved SAC layer etch back process P4 is a wet etching process, a dry etching process, or combinations thereof. In some embodiments, the improved SAC layer etch back process P4 is a plasma etching process. For the sake of clarity, the plasma etching process described herein is referred to as a third plasma etching process.

In some embodiments, the third plasma etching process P4 using a fourth reactant gas (e.g., a fluorine-containing gas, such as $CH_3F$) is performed to thin down the dielectric caps 270. In some embodiments, the third plasma etching process P4 uses a gas mixture of $CH_3F$, He, and Ar with a bias in a range from about 25V to about 1200V. In some embodiments, the fourth plasma etching process P4 uses a gas mixture of $CH_3F$, He, and Ar without a bias. In some embodiments, the fourth reactant of the third plasma etching process P4 may be the same as the second reactant gas of the second plasma etching process P2 as shown in FIGS. 17A-18B. In some embodiments, the fourth reactant of the third plasma etching process P4 may be different from the second reactant gas of the second plasma etching process P2 as shown in FIGS. 17A-18B.

Figure 22A:
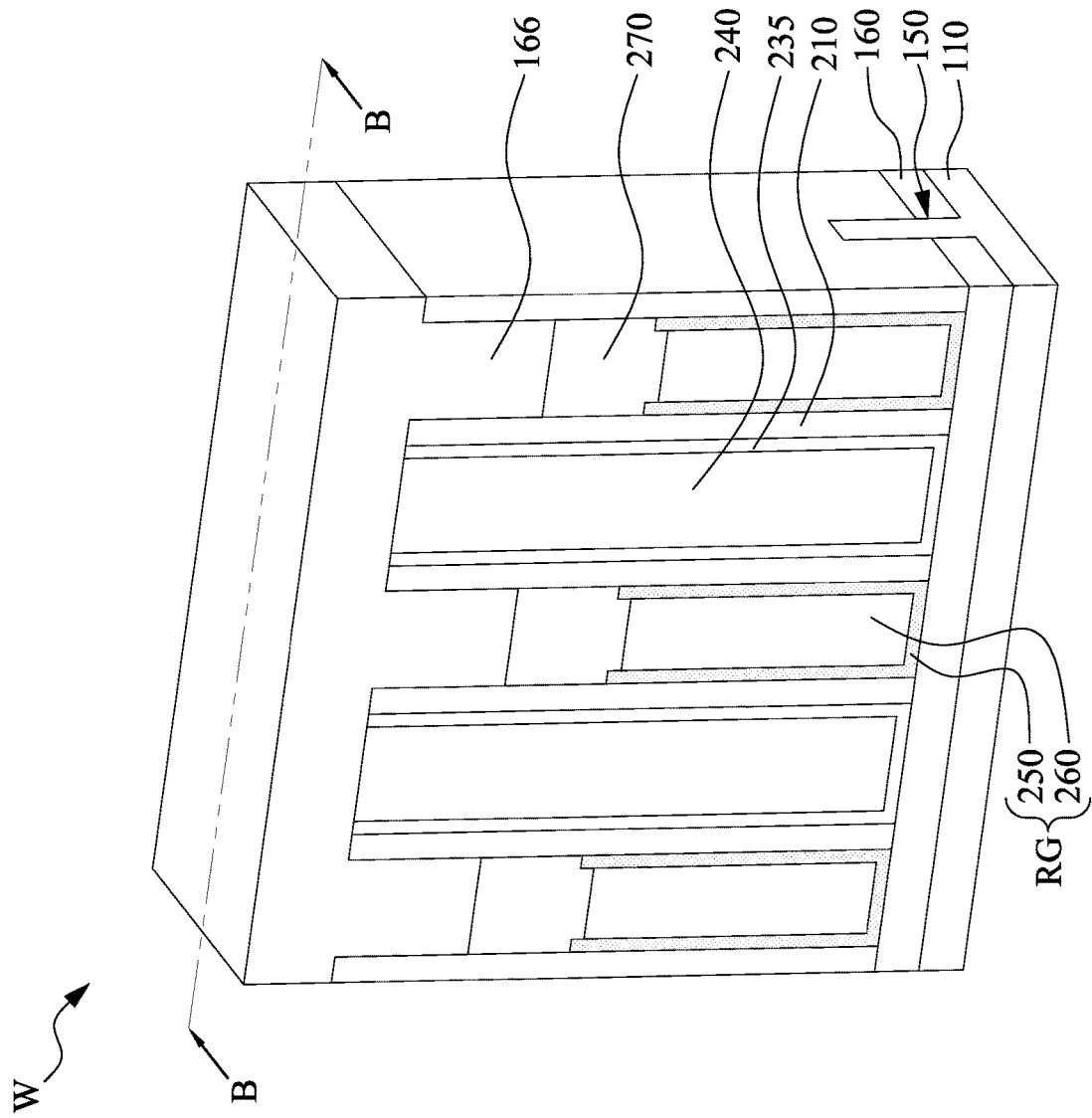
Figure 22B:
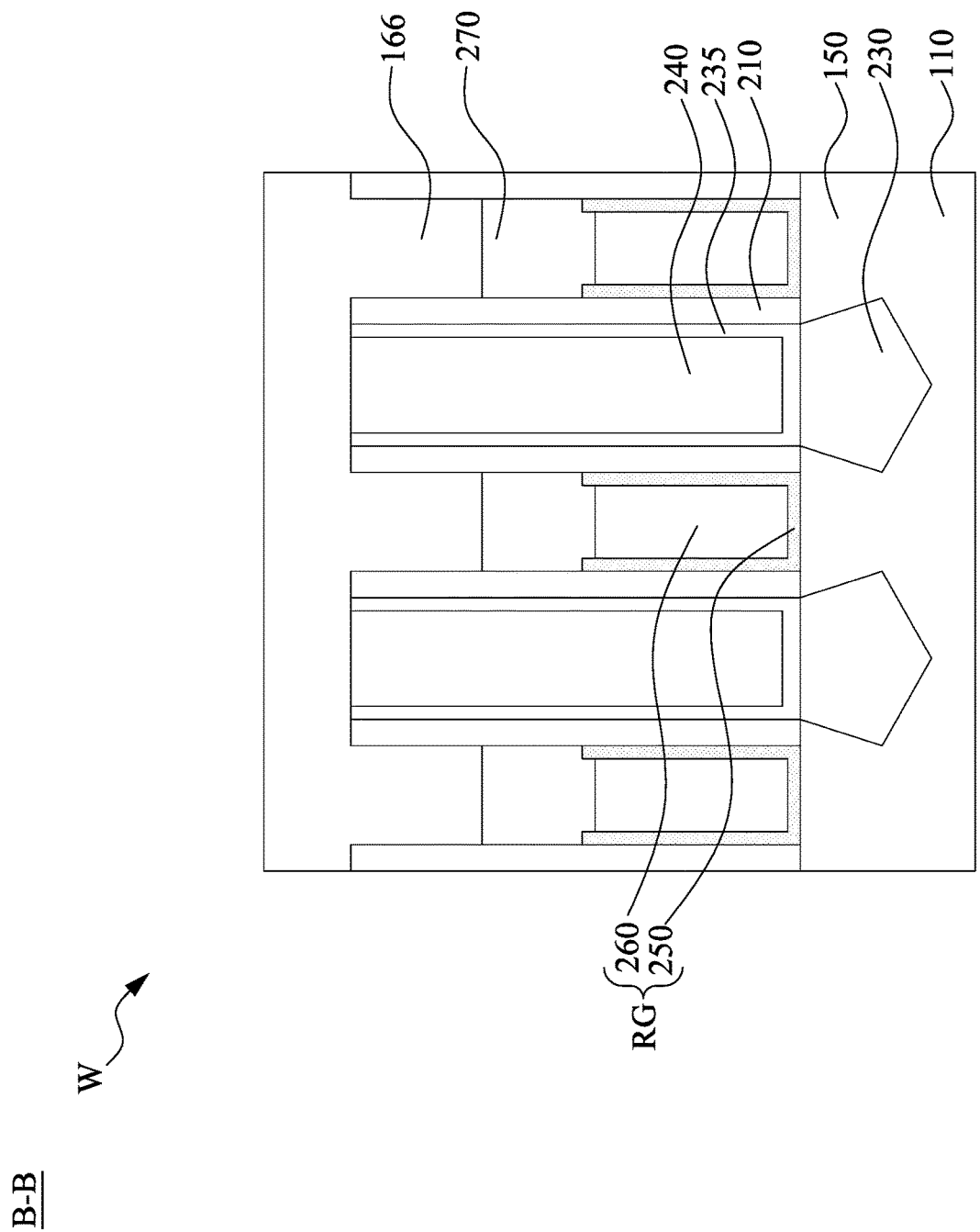

Returning to FIG. 1B, the method M then proceeds to block S27 where a hard mask material is formed over the dielectric caps. With reference to FIGS. 22A and 22B, in some embodiments of block S27, A hard mask material 166 is formed over the substrate 110 and covers the spacers 210, the CESL 235, the ILD layer 240, the gate structures RG, and the dielectric caps 270. Furthermore, the dielectric cap 270 is in contact with the work function metal 260 and the hard mask material 166 and between the spacers 210.

In some embodiments, the hard mask material 166 includes dielectric material such as, Si, SiO, SiN, AlO, or combinations thereof. The hard mask material 166 may include a material which is different from the spacers 210, the CESL 235, the ILD layer 240, and/or the dielectric caps 270 to achieve etching selectivity during etching processes performed later.

Figure 23A:
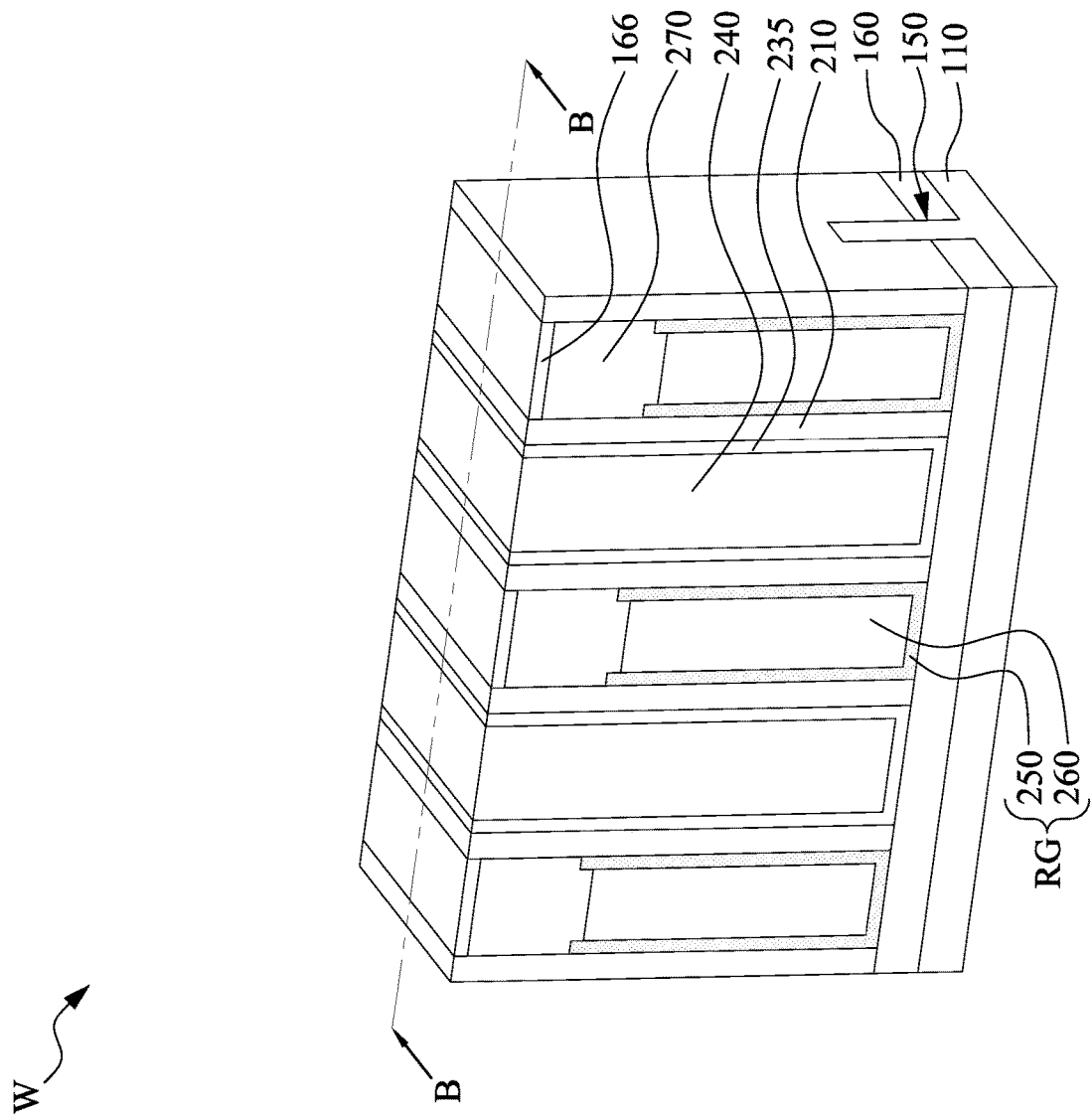
Figure 23B:
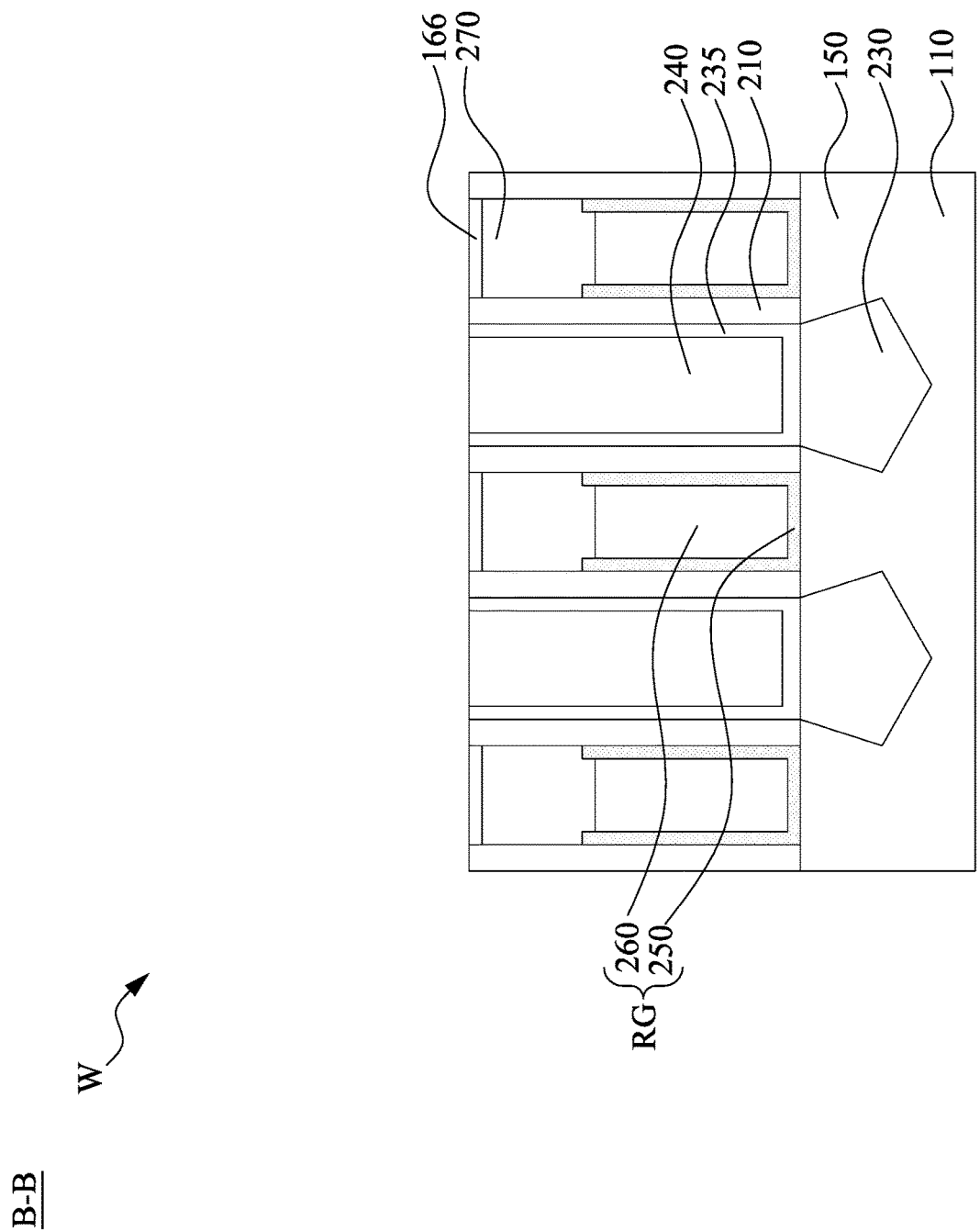

Returning to FIG. 1B, the method M then proceeds to block S28 where a planarization process is performed to the hard mask material. With reference to FIGS. 23A and 23B, in some embodiments of block S28, after the hard mask material 166 is formed, one or more CMP processes are performed to polish back the hard mask material 166 until the spacers 210, the CESL 235, and the ILD layer 240 are exposed. Because the dielectric cap 270 has a flattened top surface, rather than a concave top surface, a bottommost position of the resulting hard mask layer 166 is not lower than a topmost position of the dielectric cap 270.

Returning to FIG. 1B, the method M then proceeds to block S29 where a gate contact is formed to land on the gate structure. With reference to FIG. 24, in some embodiments of block S29, a contact hole may be formed by any suitable process in the hard mask layer 166 and the dielectric cap 270. Subsequently, a conductive material layer fills in the contact hole. In some embodiments, the conductive material layer includes TiN, TaN, Ta, Ti, Hf, Zr, Ni, W, Co, Cu, Ag, Al, Zn, Ca, Au, Mg, Mo, Cr, or the like. In some embodiments, the conductive material layer may be formed by CVD, PVD, plating, ALD, or other suitable technique. Subsequently, A CMP process is performed to remove a portion of the conductive material layer above a top surface of the hard mask layer 166. After planarization, the gate contact 290 is formed. The gate contact 290 goes through the hard mask layer 166 and the dielectric cap 270 to provide electrical contact to the work function metal 260.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that a distance between a top surface of the work function metal and a top surface of the gate dielectric layer is decreased to less than 1 nm. As such, when the gate contact lands on the top surface of the work function metal, it may reduce the chance that the gate contact may be in contact with the gate dielectric layer which in turn adversely affects the performance of the semiconductor device.

In greater detail, the present disclosure uses a plasma etching process including a bromine-containing gas to thin down the gate dielectric layer and simultaneously to form a protection layer over the work function metal to protect the work function metal during the plasma etching process. After the performing of the plasma etching process, a top surface of the protection layer may be substantially coplanar with a top surface of the gate dielectric layer. As such, the distance between top surfaces of the work function metal and the gate dielectric layer may be controlled by the thickness of the protection layer due to the bromine-containing gas, such as less than about 1 nm.

In some embodiments, a method for manufacturing a semiconductor device includes forming a dummy gate structure on a semiconductor fin; forming a plurality of gate spacers on opposite sidewalls of the dummy gate structure; removing the dummy gate structure from the semiconductor fin; forming a gate structure on the semiconductor fin and between the gate spacers, wherein the gate structure includes a gate dielectric layer and a work function metal over the gate dielectric layer; performing a first plasma etching process by using a first reactant to etch back the gate structure performing a second plasma etching process by using a second reactant on the gate structure, wherein the first plasma etching process has a first removal rate of the gate dielectric layer, the second plasma etching process has a second removal rate of the gate dielectric layer, and the second removal rate is greater than the first removal rate.

In some embodiments, a method for manufacturing a semiconductor device includes forming a dummy gate structure on a semiconductor substrate; forming a plurality of gate spacers on opposite sidewalls of the dummy gate structure; removing the dummy gate structure from the semiconductor substrate; forming a gate structure on the semiconductor substrate and between the gate spacers, in which the gate structure includes a gate dielectric layer and a work function metal over the gate dielectric layer; forming a protection layer over the work function metal of the gate structure while leaving the gate dielectric layer of the etched-back gate structure uncovered; and etching back the gate dielectric layer of the etched-back gate structure.

In some embodiments, a semiconductor device includes a substrate, a semiconductor fin, gate spacers, a gate structure.

The semiconductor fin is on the substrate. The gate spacers are over the semiconductor fin. The gate structure is on the semiconductor fin and between the gate spacers. The gate structure includes a gate dielectric layer and a first work function metal over the gate dielectric layer, in which a top surface of the first work function metal is lower than a top surface of the gate dielectric layer, and a distance between the top surface of the first work function metal and the top surface of the gate dielectric layer is less than about 1 nm. In some embodiments, the semiconductor device further includes In some embodiments, a distance between the top end of the second work function metal and the top surface of the gate dielectric layer is less than about 1 nm. In some embodiments, the top end of the second work function metal is higher than the top surface of the first work function metal. In some embodiments, the semiconductor device further includes a dielectric cap atop the gate structure and between the gate spacers. In some embodiments, the semiconductor device further includes a hard mask atop the dielectric cap and between the gate spacers. In some embodiments, the semiconductor device further includes a gate contact extending through the dielectric cap to the gate structure. In some embodiments, the gate contact has a bottom end lower than the top surface of the gate dielectric layer. In some embodiments, the first work function metal is made of tantalum nitride or titanium nitride. In some embodiments, the gate dielectric layer is made of metal oxide.

In some embodiments, a semiconductor device includes a semiconductive channel pattern, a gate pattern, a bromine-containing polymer, and source and drain patterns. The gate pattern extends across the semiconductive channel pattern from a top view, and comprises a metal structure and a high-k dielectric layer cupping an underside of the metal structure from a cross-sectional view. The bromine-containing polymer extends along a top surface of the metal structure and terminates prior to covering a top surface of the high-k dielectric layer. The source and drain patterns are on opposite sides of the gate pattern from the top view. In some embodiments, the bromine-containing polymer has a topmost position lower than a topmost position of the high-k dielectric layer. In some embodiments, the bromine-containing polymer has a top surface and a bottom surface more curved than the top surface. In some embodiments, the bromine-containing polymer has a top surface less steep than a top surface of the high-k dielectric layer. In some embodiments, the bromine-containing polymer is localized within the top surface of the metal structure. In some embodiments, the bromine-containing polymer comprises metal bromide.

In some embodiments, a semiconductor device includes a nanostructured pedestal, a dielectric layer, a first metal, a second metal, and doped epitaxial structures. The nanostructured pedestal is on a substrate and has a top surface and opposite side surfaces. The dielectric layer wraps around the top surface and the opposite side surfaces of the nanostructured pedestal. The first metal is over the dielectric layer. The second metal is over the first metal and has a top surface extending in a steeper slope than a top surface of the second metal. The doped epitaxial structures are on the nanostructured pedestal and sandwich the dielectric layer, the first metal and the second metal. In some embodiments, the dielectric layer has a top surface extending in a steeper slope than the top surface of the first metal. In some embodiments, the doped epitaxial structures are of n-type. In some embodiments, the doped epitaxial structures are of p-type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate structure across a channel region from a top view, the gate structure comprising a work function metal and a gate dielectric layer wrapping around the work function metal, the gate dielectric layer having a U-shaped cross-sectional profile;
   performing a first plasma etching process, by using a first chlorine-containing reactant, on the gate structure; and
   performing a second plasma etching process, by using a bromine-containing reactant, on the gate structure, wherein the bromine-containing reactant forms a metal bromide layer.

2. The method of claim 1, wherein the first chlorine-containing reactant is free of bromine.

3. The method of claim 1, wherein the first chlorine-containing reactant comprises boron trichloride.

4. The method of claim 1, wherein the bromine-containing reactant comprises hydrogen bromide.

5. The method of claim 1, wherein the second plasma etching process is performed after the first plasma etching process.

6. The method of claim 1, wherein the second plasma etching process is performed by further using a reactant different than the bromine-containing reactant.

7. The method of claim 6, wherein the reactant is a second chlorine-containing reactant.

8. The method of claim 1, further comprising:
   after performing the second plasma etching process, performing an ashing process on the gate structure.

9. The method of claim 1, wherein the work function metal comprises tantalum nitride, titanium nitride, or a combination thereof.

10. The method of claim 1, wherein the gate dielectric layer is made of metal oxide.

11. A method, comprising:
    forming a channel region over a substrate;
    forming an epitaxial source/drain structure adjacent to a sidewall of the channel region;
    forming a gate structure over the channel region, the gate structure interfacing at least three surfaces of the channel region, wherein the gate structure comprises a work function metal and a gate dielectric layer around the work function metal, the gate dielectric layer has a U-shaped cross-sectional profile, and a top surface of the gate structure has a curved profile;
    performing a chlorine-containing etching process on the work function metal; and
    performing a bromine-containing etching process on the gate dielectric layer, wherein performing the bromine-containing etching process forms a metal bromide layer.

12. The method of claim 11, wherein the metal bromide layer is formed over the work function metal.

13. The method of claim 12, wherein the metal bromide layer has a thickness less than about 1 nm.

14. The method of claim 12, wherein the metal bromide layer comprises titanium bromide, tantalum bromide, or a combination thereof.

15. The method of claim 12, further comprising:
after performing the bromine-containing etching process, performing an ashing process on the metal bromide layer.

16. A method, comprising:
forming a channel region over a substrate;
forming an isolation dielectric disposed over the substrate and around a lower portion of the channel region;
forming a gate spacer over the isolation dielectric, wherein at least a portion of the gate spacer is over the channel region;
forming a gate structure extending along surfaces of a top portion of the channel region and a top surface of the isolation dielectric, wherein the gate structure comprises a work function metal and a gate dielectric layer around the work function metal, the gate dielectric layer has a U-shaped cross-sectional profile, the gate spacer extends along a sidewall of the gate structure, and a thickness of the gate spacer is greater than a thickness of the gate dielectric layer;
performing a chlorine-containing etching process on the gate structure; and
performing a bromine-containing etching process on the gate structure, wherein performing the bromine-containing etching process forms a metal bromide layer.

17. The method of claim 16, wherein the work function metal comprises tantalum nitride, titanium nitride, or a combination thereof.

18. The method of claim 16, wherein the bromine-containing etching process is performed such that a metal bromide forms over the work function metal.

19. The method of claim 18, wherein the metal bromide has a top surface and a bottom surface more curved than the top surface.

20. The method of claim 18, wherein the metal bromide has a topmost position lower than a topmost position of the gate dielectric layer.

* * * * *